United States Patent
Lee et al.

(10) Patent No.: US 12,139,640 B2
(45) Date of Patent: Nov. 12, 2024

(54) INSULATING AND HEAT-RADIATING COATING COMPOSITION, AND INSULATING AND HEAT-RADIATING PRODUCT IMPLEMENTED THEREWITH

(71) Applicants: AMOSENSE CO., LTD, Cheonan-si (KR); AMOGREENTECH CO., LTD., Gimpo-si (KR)

(72) Inventors: Hwan Ku Lee, Suwon-si (KR); Seung Jae Hwang, Incheon (KR); Beom Jun Kim, Seongnam-si (KR); Moon Young Hwang, Incheon (KR)

(73) Assignees: AMOSENSE CO., LTD., Cheonan-si (KR); AMOGREENTECH CO., LTD., Gimpo-si (KR)

( * ) Notice: Subject to any disclaimer, the term of this patent is extended or adjusted under 35 U.S.C. 154(b) by 1579 days.

Patent file contains an affidavit/declaration under 37 CFR 1.130(b).

(21) Appl. No.: 16/316,142

(22) PCT Filed: Jan. 3, 2018

(86) PCT No.: PCT/KR2018/000088
§ 371 (c)(1),
(2) Date: Jan. 8, 2019

(87) PCT Pub. No.: WO2018/128368
PCT Pub. Date: Jul. 12, 2018

(65) Prior Publication Data
US 2021/0284850 A1    Sep. 16, 2021

(30) Foreign Application Priority Data

Jan. 3, 2017 (KR) .......................... 10-2017-0000513

(51) Int. Cl.
*C09D 7/61* (2018.01)
*C09D 5/18* (2006.01)
(Continued)

(52) U.S. Cl.
CPC .................. *C09D 7/61* (2018.01); *C09D 5/18* (2013.01); *C09D 7/42* (2018.01); *C09D 163/00* (2013.01);
(Continued)

(58) Field of Classification Search
CPC ... C09D 7/61; C09D 7/42; C09D 5/18; C09D 163/00; H05K 1/0203; H05K 7/2039;
(Continued)

(56) References Cited

U.S. PATENT DOCUMENTS 10,047,256 B2    8/2018 Yoshimoto et al.
11,250,986 B2 *  2/2022 Hwang .................. H01F 27/28
(Continued)

FOREIGN PATENT DOCUMENTS

CN    105860754 A    8/2016
JP    2002371123 A   12/2002
(Continued)

OTHER PUBLICATIONS

English machine translation of JP2013-071960.*
International Search Report cited in PCT/KR2018/000088 dated May 2, 2018, 2 pages.

*Primary Examiner* — Robert S Walters, Jr.
(74) *Attorney, Agent, or Firm* — Rothwell, Figg, Ernst & Manbeck, P.C.

(57) ABSTRACT

An insulating heat-radiating coating composition including a coating layer-forming component including a main resin; and an insulating heat-radiating filler, which not only is capable of exhibiting excellent heat-radiating performance due to excellent thermal conductivity and heat radiation but
(Continued)

also forms an insulating heat-radiating coating layer having a heat-insulating property. In addition, an insulating heat-radiating coating layer formed using the insulating heat-radiating coating composition has excellent adhesiveness to a surface to be coated, thereby remarkably preventing the peeling of an insulating heat-radiating coating layer during use and maintaining the durability of the insulating heat-radiating coating layer against physical and chemical stimuli such as external heat, organic solvents, moisture, and impact after formation of the insulating heat-radiating coating layer.

11 Claims, 4 Drawing Sheets

(51) Int. Cl.
  *C09D 7/42*  (2018.01)
  *C09D 163/00*  (2006.01)
  *H05K 1/02*  (2006.01)
  *H05K 7/20*  (2006.01)
  C08K 5/5333  (2006.01)
  C08K 5/5435  (2006.01)
  F21V 29/74  (2015.01)

(52) U.S. Cl.
  CPC ......... *H05K 1/0203* (2013.01); *H05K 7/2039* (2013.01); *C08K 5/5333* (2013.01); *C08K 5/5435* (2013.01); *C08K 2201/001* (2013.01); *F21V 29/74* (2015.01)

(58) Field of Classification Search
  CPC ..... F21V 29/74; C08K 5/5333; C08K 5/5435; C08K 2201/001
  See application file for complete search history.

(56) References Cited

U.S. PATENT DOCUMENTS

| | | |
|---|---|---|
| 2010/0304162 A1 | 12/2010 | Chong et al. |
| 2016/0122604 A1* | 5/2016 | Yoshimoto ............. C08G 59/32 252/74 |
| 2019/0111763 A1* | 4/2019 | Lim ....................... F24H 9/1872 |
| 2019/0272948 A1* | 9/2019 | Hwang .................... C09K 5/14 |
| 2020/0154608 A1* | 5/2020 | Kim ................... H05K 7/20427 |

FOREIGN PATENT DOCUMENTS

| | | | |
|---|---|---|---|
| JP | 2011192773 A | 9/2011 | |
| JP | 2012144638 A | 8/2012 | |
| JP | 2013071960 A | 4/2013 | |
| KR | 20140043031 A | 4/2014 | |
| KR | 20150127648 A | 11/2015 | |
| KR | 20160120685 A | 10/2016 | |
| KR | 101756824 B1 | 7/2017 | |
| WO | 2016010067 A1 | 1/2016 | |
| WO | 2016197305 A1 | 12/2016 | |
| WO | WO-2017171392 A1 * | 10/2017 | ........... B60H 1/2225 |
| WO | WO-2017204562 A1 * | 11/2017 | ............... C08K 3/40 |
| WO | WO-2017204565 A1 * | 11/2017 | ........... C09D 163/00 |

\* cited by examiner

INSULATING AND HEAT-RADIATING COATING COMPOSITION, AND INSULATING AND HEAT-RADIATING PRODUCT IMPLEMENTED THEREWITH

CROSS REFERENCE TO RELATED APPLICATION

This application is a 35 U.S.C. 371 National Phase Entry Application from PCT/KR2018/000088, filed Jan. 3, 2018, which claims the benefit of Korean Patent Application No. 10-2017-0000513 filed on Jan. 3, 2017, the disclosures of which are incorporated herein by reference in their entireties.

TECHNICAL FIELD

The present invention relates to an insulating heat-radiating coating composition, and more particularly to an insulating heat-radiating coating composition exhibiting both a heat-radiating property and an electrical-insulating property and an insulating heat-radiating article implemented using the same.

BACKGROUND ART

Generally, a heat-radiating member is mounted on various heat-generating components so as to prevent malfunctions caused by heat generated from the components provided in an electronic apparatus during use of the electronic apparatus. Heat-radiating members, such as a heat-radiating plate and a heat sink, are typically made of a metal having high thermal conductivity so that heat inside devices or components can be rapidly discharged to the outside.

For example, a heat sink is formed by heating and melting aluminum, copper, or an alloy thereof at a high temperature, and then extruding the same using a metal mold with a predetermined shape to form a plurality of heat-radiating fins regularly protruding to the front.

In recent years, attempts have been made to improve heat-radiating performance by forming a heat-radiating coating layer on a heat-radiating member.

However, since fillers for improving heat-radiating performance included in a heat-radiating coating layer have conductivity due to a large amount of conductive components included therein, it is difficult to apply the filler to fields requiring a heat-radiating property and an electrical insulating property.

In addition, it is difficult to achieve all of the properties, such as durability, heat-radiating performance, and adhesion to a surface to be coated, of an insulating heat-radiating coating layer while exhibiting both heat-insulating and heat-radiating properties, and the insulating heat-radiating coating layer exhibits poor surface quality such as an uneven surface thereof and a filler protruding from a surface thereof. Further, since a filler is not uniformly distributed in an insulating heat-radiating coating layer, the insulating and heat-radiating performances thereof are not constant.

Therefore, there is an urgent need for research on a composition for forming an insulating heat-radiating coating layer, which has excellent adhesive strength to a surface to be coated and excellent durability against external physical and chemical stimuli such as heat/moisture/organic solvents, is capable of realizing an insulating heat-radiating coating layer having excellent surface quality and remarkably improving both a heat-insulating property and a heat-radiating performance, and allows excellent dispersibility of a filler in an insulating heat-radiating coating layer.

DISCLOSURE

Technical Problem

Therefore, the present invention has been made in view of the above problems, and it is one object of the present invention to provide an insulating heat-radiating coating composition that is capable of forming an insulating heat-radiating coating layer exhibiting excellent heat-radiating performance, due to excellent thermal conductivity and heat radiation.

It is another object of the present invention to provide an insulating heat-radiating coating composition that is capable of forming an insulating heat-radiating coating layer provided in direct contact with various electrical and electronic components and devices requiring a heat-radiating property, due to both a heat-radiating property and a heat-insulating property.

It is still another object of the present invention to provide an insulating heat-radiating coating composition that is capable of remarkably preventing the peeling of an insulating heat-radiating coating layer during use and maintaining durability of the insulating heat-radiating coating layer against physical and chemical stimuli such as external heat, organic solvents, moisture, and impact, due to excellent adhesive strength to a surface to be coated.

It is yet another object of the present invention to provide an insulating heat-radiating coating composition that is capable of forming an insulating heat-radiating coating layer having a very soft surface and excellent surface quality due to excellent smoothness.

It is yet another object of the present invention to provide an insulating heat-radiating coating composition that is capable of exhibiting uniform insulating and heat-radiating performance due to excellent dispersibility of a heat-radiating filler dispersed in an insulating heat-radiating coating layer.

It is yet another object of the present invention to provide an insulating heat-radiating article that is capable of exhibiting an excellent heat-radiating property without electrical short-circuit even when a surface to be attached requiring various heat-insulating properties is treated with an insulating heat-radiating coating composition.

Technical Solution

In accordance with an aspect of the present invention, the above and other objects can be achieved by the provision of an insulating heat-radiating coating composition including a coating layer-forming component including a main resin; and an insulating heat-radiating filler included in an amount of 25 to 70 parts by weight based on 100 parts by weight of the main resin.

In accordance with an embodiment of the present invention, the main resin may include one or more selected from the group consisting of a glycidyl ether-type epoxy resin, a glycidyl amine-type epoxy resin, a glycidyl ester-type epoxy resin, a linear aliphatic epoxy resin, a rubber-modified epoxy resin, and a derivative thereof.

In addition, the main resin includes a compound represented by Formula 1 below:

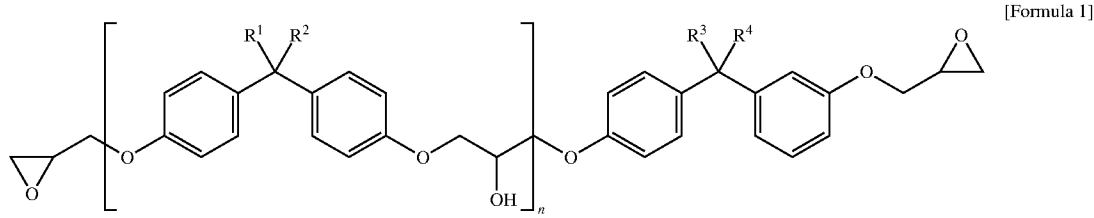

[Formula 1]

wherein R¹ and R² are each independently a hydrogen atom, a C1 to C5 straight-chain alkyl group, or a C3 to C5 branched alkyl group, R³ and R⁴ are each independently a hydrogen atom, a C1 to C5 straight-chain alkyl group, or a C3 to C5 branched alkyl group, and n is a rational number such that the compound represented by Formula 1 has a weight average molecular weight of 400 to 4000.

In addition, the insulating heat-radiating filler may have a thermal conductivity of 130 to 200 W/m·K.

In addition, the coating layer-forming component may further include 25 to 100 parts by weight of a curing agent based on 100 parts by weight of the main resin.

In addition, the curing agent may include one or more selected from the group consisting of an aliphatic polyamine-based curing agent, an aromatic polyamine-based curing agent, an acid anhydride-based curing agent, and a catalyst-based curing agent.

In addition, the curing agent may include a first curing agent including an aliphatic polyamine-based curing agent and a second curing agent including one or more selected from the group consisting of an aromatic polyamine-based curing agent, an acid anhydride-based curing agent, and a catalyst-based curing agent in a weight ratio of 1:0.5 to 1.5.

In addition, the aliphatic polyamine-based curing agent may include polyethylene polyamine.

In addition, the insulating heat-radiating coating composition may further include 0.5 to 20 parts by weight of a property-enhancing component for improving adhesion based on 100 parts by weight of the main resin.

In addition, the property-enhancing component may include one or more selected from the group consisting of 3-[N-anil-N-(2-aminoethyl)] aminopropyltrimethoxysilane, 3-(N-anil-N-glycidyl)aminopropyltrimethoxysilane, 3-(N-anil-N-methacryloyl]aminopropyltrimethoxysilane, 3-glycidyl oxypropylmethylethoxysilane, N,N-bis[3-(trimethoxysilyl)propyl]methacrylamide, γ-glycidoxytrimethyldimethoxysilane, 3-glycidyloxypropyltrimethoxysilane, 3-glycidyloxypropyltriethoxysilane, 3-glycidyloxypropylmethylmethoxysilane, beta(3, 4-epoxy cyclohexyl)ethyltrimethoxysilane, 3-methacryloxypropyltrimethoxysilane, 3-glycidoxypropylmethyldimethoxysilane, heptadecafluorodecyltrimethoxysilane, 3-methacryloxypropylmethyldimethoxysilane, 3-methacryloxypropyltris(trimethylsiloxy)silane, methyltris(dimethylsiloxy)silane, 3-aminopropyltriepoxy silane, 3-mercaptopropyltrimethoxy silane, and N-(β-aminoethyl)-γ-aminopropyltrimethoxysilane.

In addition, the insulating heat-radiating filler may include silicon carbide.

In addition, the insulating heat-radiating filler may have an average particle diameter of 10 nm to 15 μm.

In addition, in the insulating heat-radiating filler, a ratio of D50 to D97 may be 1:4.5 or less.

In addition, the insulating heat-radiating coating composition may have a viscosity of 5 to 600 cps.

In addition, the insulating heat-radiating coating composition may include, based on 100 parts by weight of the main resin, 30 to 60 parts by weight of one or more colorants selected from the group consisting of talc, zinc oxide, zinc sulfide, a metal oxide-based colorant, a hydroxyl-based colorant, a sulfide-based colorant, an azo-based colorant, a nitro-based colorant, and a phthalocyanine-based colorant; and 30 to 60 parts by weight of one or more quenchers selected from the group consisting of titanium dioxide, aerogel silica, hydrogel silica, PP wax, PE wax, PTFE wax, a urea formaldehyde resin, and a benzoguanamine formaldehyde resin.

In addition, the insulating heat-radiating coating composition may include 10 to 35 parts by weight of one or more flame retardants selected from the group consisting of trizinc bis(orthophosphate), triphenyl phosphate, trixylenyl phosphate, tricresyl phosphate, triisophenyl phosphate, tris-choloroethylphosphate, tris-chloropropylphosphate, resorcinol di-phosphate, aromatic polyphosphates, polyphosphoric acid ammonium, and red phosphorous, based on 100 parts by weight of the main resin.

In addition, the insulating heat-radiating coating composition may further include 0.5 to 20 parts by weight of a dispersant based on 100 parts by weight of the insulating heat-radiating filler.

In addition, a heat-radiating unit including an insulating heat-radiating coating layer with a thickness of 25 μm, formed by treating an aluminum plate with a thickness of 1.5 mm with the insulating heat-radiating coating composition, followed by curing, may satisfy the following condition (1):

(1) a heat source is placed at the center of a lower part of the heat-radiating unit in a closed system at 25° C. and 50% humidity and, after 90 minutes, temperatures at any 10 points on a circle with a radius of 15 mm centered on the center of an upper surface of the heat-radiating unit are measured. A heat-radiating temperature deviation calculated according to Equation 1 below is within ±1% at each of the points:

[Equation 1]

$$\text{Heat-radiating temperature error (\%)} = \frac{\text{(Average temperature of any 10 points (° C.))} - \text{(Temperature at each point (° C.))}}{\text{(Average temperature of any 10 points (° C.))}} \times 100 \ (\%)$$

In addition, a heat-radiating unit including an insulating heat-radiating coating layer with a thickness of 25 μm, formed by treating an aluminum plate with a thickness of 1.5 mm and a width and length of 35 mm×34 mm with the insulating heat-radiating coating composition followed by curing, may satisfy the following condition (2):

(2) a 88° C. heat source is placed at the center of a lower part of the heat-radiating unit in a closed system at 25° C.

and 50% humidity and, after 90 minutes, a temperature at a point 5 cm away from the center of an upper part of the heat-radiating unit is measured. A heat-radiating efficiency calculated according to Equation 3 below is 10% or more:

[Equation 3]

$$\text{Heat-radiating efficiency (\%)} = \left(\left(\frac{\text{Temperature (\%) at point 5 cm away from center of upper part of heat-radiating unit}}{\text{Temperature (\%) at point 5 cm away from center of upper part of non-coated heat-radiating unit}}\right) - 1\right) \times 100 \ (\%)$$

In accordance with another aspect of the present invention, there is provided an insulating heat-radiating unit including a heat-radiating member or a support member; and an insulating heat-radiating coating layer formed by treating at least a portion of an outer surface of the heat-radiating member or support member with the insulating heat-radiating coating composition according to the present invention, followed by curing.

In accordance with an embodiment of the present invention, the insulating heat-radiating coating layer has a relative gain of thermal conductivity of greater than 200% according to Equation 2 below:

[Equation 2]

$$\text{Relative gain (\%)} = \frac{\left(\text{Thermal conductivity of insulating heat-radiating coating layer } (Wm^{-1}K^1)\right) - \left(\text{Thermal conductivity of coating layer excluding heat-radiating filler } (Wm^{-1}K^1)\right)}{\left(\text{Thermal conductivity of coating layer excluding heat-radiating filler } (Wm^{-1}K^1)\right)} \times 100 \ (\%)$$

In addition, the insulating heat-radiating coating layer may have a thickness of 15 to 50 μm.

In addition, the insulating heat-radiating unit may have a resistance value per unit area of $10^{10}$ to $10^{14}$ Ω/sq.

In accordance with still another aspect of the present invention, there is provided an insulating heat-radiating circuit board including a circuit board on which an element is mounted; and an insulating heat-radiating coating layer formed by treating at least a portion of an outer surface of the circuit board with the insulating heat-radiating coating composition according to the present invention, followed by curing.

In accordance with yet another aspect of the present invention, there is provided an insulating heat-radiating component for lighting, which includes an insulating heat-radiating coating layer formed by treating at least a portion of an outer surface of the insulating heat-radiating component with the insulating heat-radiating coating composition according to the present invention, followed by curing.

Advantageous Effects

The present invention provides an insulating heat-radiating coating composition that not only is capable of exhibiting excellent heat-radiating performance due to excellent thermal conductivity and heat radiation but also forms an insulating heat-radiating coating layer having a heat-insulating property. In addition, an insulating heat-radiating coating layer formed using the insulating heat-radiating coating composition has excellent adhesiveness to a surface to be coated, thereby remarkably preventing the peeling of an insulating heat-radiating coating layer during use and maintaining the durability of the insulating heat-radiating coating layer against physical and chemical stimuli such as external heat, organic solvents, moisture, and impact after formation of the insulating heat-radiating coating layer. In addition, since a heat-radiating filler dispersed in a formed insulating heat-radiating coating layer has excellent dispersibility, uniform insulating and heat-radiating performance can be exhibited. Further, since a surface of the formed insulating heat-radiating coating layer is very soft and has excellent surface quality due to excellent smoothness, the formed insulating heat-radiating coating layer can be broadly applied to all industries requiring both insulating and heat-radiating properties.

BEST MODE FOR CARRYING OUT THE INVENTION

Figure 1:
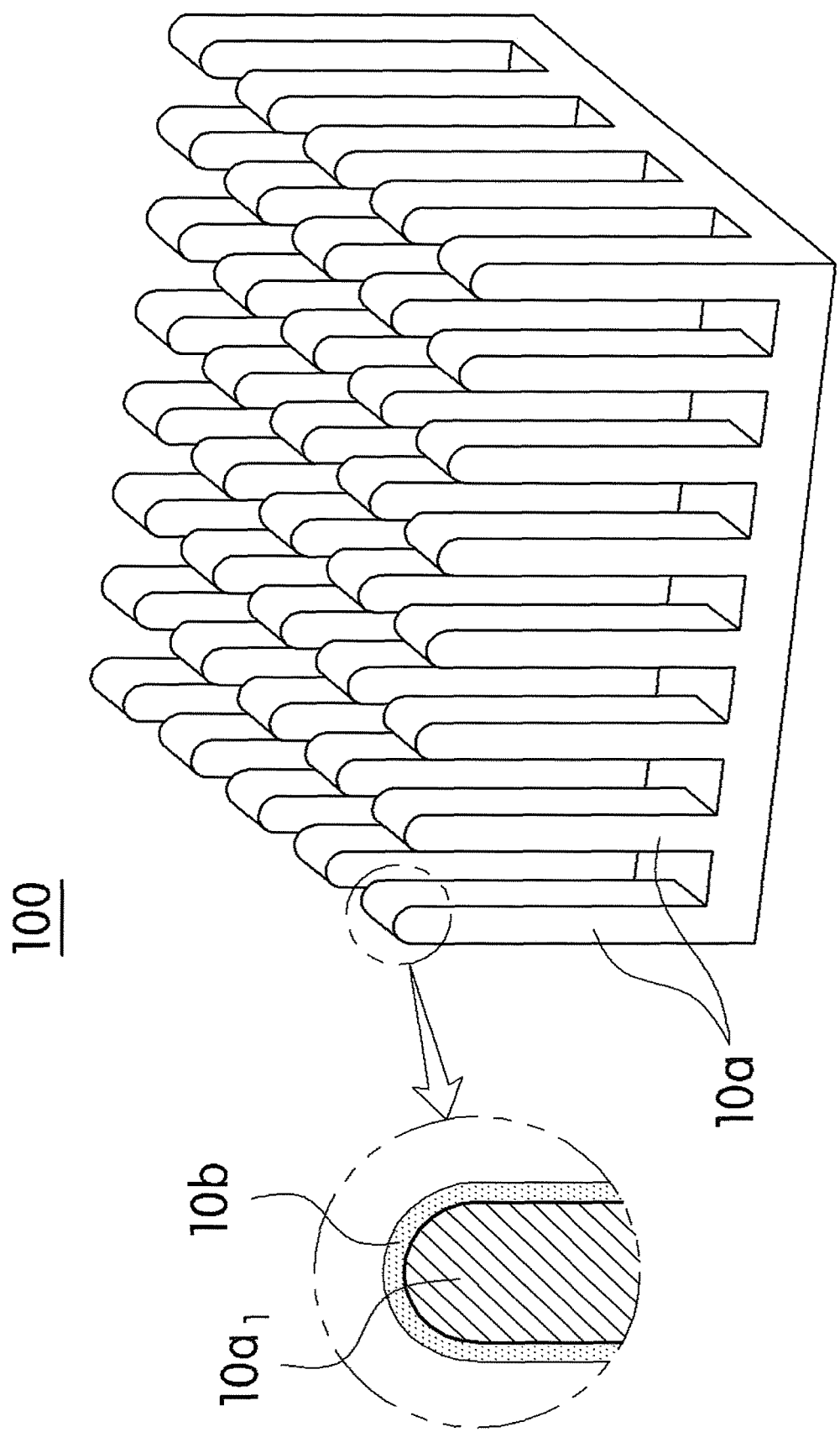
FIGS. 1 and 2 illustrate a perspective view and a partial cross-sectional view of an insulating heat-radiating unit according to embodiments of the present invention.

Hereinafter, embodiments of the present invention will be described in detail so that those of ordinary skill in the art can easily carry out the present invention. As those skilled in the art would realize, the described embodiments may be modified in various different ways without departing from the spirit or scope of the present invention.

An insulating heat-radiating coating composition according to an embodiment of the present invention includes a coating layer-forming component including a main resin; and an insulating heat-radiating filler included in an amount of 25 to 70 parts by weight based on 100 parts by weight of the main resin.

First, the coating layer-forming component will be described.

The coating layer-forming component includes a main resin. When the main resin is a curable resin, a curing agent may be further included.

The main resin may form a coating layer and may be used without specific limitation as long as it is a known component in the art. However, to improve adhesiveness to a substrate to be coated, prevent deterioration of heat resistance due to heat generated from a heat-radiating substrate and deterioration of a heat-insulating property due to electrical stimulation, improve mechanical strength, improve heat-radiating performance through improvement of compatibility with an insulating heat-radiating filler, and improve dispersibility of a heat-radiating filler, the main resin may include one or more selected from the group consisting of a glycidyl ether-type epoxy resin, a glycidyl amine-type epoxy resin, a glycidyl ester-type epoxy resin, a linear aliphatic epoxy resin, a rubber-modified epoxy resin, and a derivative thereof.

In particular, examples of the glycidyl ether-type epoxy resin include phenolic glycidyl ether resins and alcoholic glycidyl ether resins. The phenolic glycidyl ether resins include bisphenolic epoxy resins such as bisphenol A resins, bisphenol B resins, bisphenol AD resins, bisphenol S resins, bisphenol F resins, and resorcinol, phenol novolac resins such as phenol novolac epoxy resins, aralkyl phenol novolac resins, and terpenephenol novolac resins, cresolnovolac epoxy resins such as o-cresolnovolac epoxy, and the like. These resins may be used alone or in combination of two or more thereof.

Examples of the glycidyl amine-type epoxy resin include diglycidylaniline, tetraglycidyldiaminodiphenylmethane, N,N,N',N'-tetraglycidyl-m-xylylenediamine, 1,3-bis(diglycidylaminomethyl)cyclohexane, triglycidyl-m-aminophenol including both a glycidyl ether structure and a glycidyl amine structure, triglycidyl-p-aminophenol, and the like. These resins may be used alone or in combination of two or more thereof.

Examples of the glycidyl ester-type epoxy resin include hydroxycarboxylic acids such as p-hydroxybenzoic acid and β-hydroxynaphthoic acid, polycarboxylic acids such as phthalic acid and terephthalic acid, and the like. These resins may be used alone or in combination of two or more thereof.

Examples of the linear aliphatic epoxy resin include glycidyl ethers by 1,4-butanediol, 1,6-hexanediol, neopentyl glycol, cyclohexane dimethanol, glycerin, trimethylol ethane, trimethylol propane, pentaerythritol, dodecahydrobisphenol A, dodecahydrobisphenol F, ethylene glycol, propylene glycol, polyethylene glycol, polypropylene glycol, and the like. These resins may be used alone or in combination of two or more thereof.

The rubber-modified epoxy resin is not particularly limited as long as its skeleton is an epoxy resin having rubber and/or polyether. For example, a rubber-modified epoxy resin such as an epoxy resin chemically bonded with a carboxy-modified butadiene-acrylonitrile elastomer in the molecule (CTBN-modified epoxy resin), acrylonitrile-butadiene rubber-modified epoxy resin (NBR-modified epoxy resin), urethane-modified epoxy resin, silicone-modified epoxy resin, and the like may be used. These resins may be used alone or in combination of two or more thereof.

However, considering a heat-radiating property due to excellent compatibility with an insulating heat-radiating filler described below, particularly silicon carbide thereamong, improved durability of an insulating heat-radiating coating layer, improved surface quality of the insulating heat-radiating coating layer, and improved dispersibility of a heat-radiating filler, the main resin may include a compound represented by Formula 1 below:

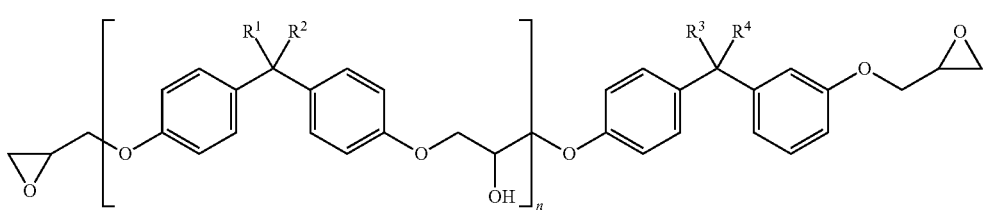

[Formula 1]

wherein $R^1$ and $R^2$ are each independently a hydrogen atom, a C1 to C5 straight-chain alkyl group, or a C3 to C5 branched alkyl group, preferably a hydrogen atom, a C1 to C3 straight-chain alkyl group, or a C3 to C4 branched alkyl group, $R^3$ and $R^4$ are each independently a hydrogen atom, a C1 to C5 straight-chain alkyl group, or a C3 to C5 branched alkyl group, preferably a hydrogen atom, a C1 to C3 straight-chain alkyl group, or a C3 to C4 branched alkyl group, and n is a rational number such that the compound represented by Formula 1 has a weight average molecular weight of 400 to 4000, preferably 450 to 3900.

When the weight average molecular weight of the compound represented by Formula 1 is less than 400, flowability of a coating composition increases, whereby it is difficult to generate an insulating heat-radiating coating layer. In addition, after generation of the insulating heat-radiating coating layer, adhesion thereof to a surface to be coated may be decreased. When the weight average molecular weight is greater than 4000, it may be difficult to manufacture an insulating heat-radiating coating layer having a uniform thickness, and it may be difficult to uniformly exhibit insulating and heat-radiating performance, upon formation of an insulating heat-radiating coating layer, due to decreased dispersibility of a heat-radiating filler in a coating composition.

In addition, a curing agent, along with the aforementioned epoxy resin used as a main resin, may be included in the coating layer-forming component. The curing agent may be selected depending upon the specific type of epoxy resin. As particular examples, curing agents known in the art may be used. Preferably, the curing agent may include any one of an aliphatic polyamine-based curing agent, an aromatic polyamine-based curing agent, an acid anhydride-based curing agent, and a catalyst-based curing agent.

As a particular example, the aliphatic polyamine-based curing agent may be polyethylene polyamine. Preferably, the aliphatic polyamine-based curing agent may include one or more selected from the group consisting of diethylene triamine (DETA), diethylaminopropylamine (DEAPA), triethylene tetramine (TETA), tetraethylene pentamine (TEPA), and menthane diamine (MDA).

In addition, the aromatic polyamine-based curing agent may include, for example, one or more selected from the group consisting of m-phenylene diamine (MPDA), diamino diphenyl sulfone (DDS) and diphenyl diamino methane (DDM).

In addition, the acid anhydride-based curing agent may include, for example, one or more selected from the group consisting of phthalic anhydride (PA), tetrahydrophthalic anhydride (THPA), methyl tetrahydrophthalic anhydride (MTHPA), hexahydrophthalic anhydride (HHPA), and methyl nadic anhydride (MNA).

In addition, the catalyst-based curing agent may include, for example, one or more selected from the group consisting of dicyandiamide (DICY), melamine, polymercaptan, methylene diphenyl diisocyanate (MDI), toluene diisocyanate (TDI), $BF_3$ mono ethylene amine ($BF_3$-MEA), benzil dimethyl amine (BDMA), and phenylimidazole.

Meanwhile, in accordance with an embodiment of the present invention, when the main resin includes the compound represented by Formula 1, the coating layer-forming component may include a first curing agent including an aliphatic polyamine-based curing agent and a second curing agent including one or more selected from the group consisting of an aromatic polyamine-based curing agent, an acid anhydride-based curing agent, and a catalyst-based curing agent, as curing agents. Accordingly, the coating layer-forming component has greatly improved compatibility with an insulating heat-radiating filler described below, particularly silicon carbide thereamong, and all properties such as adhesiveness, durability, and surface quality of the insulating heat-radiating coating layer may be advantageously improved. In addition, when a surface to which a heat-radiating coating composition will be applied is bent or stepped rather than a smooth surface, an insulating heat-radiating coating layer formed on the surface part may be advantageously prevented from being cracked or peeled off. In addition, to exhibit further improved properties, the curing agent may preferably include the first curing agent and the second curing agent in a weight ratio of 1:0.5 to 1.5, more preferably in a weight ratio of 1:0.6 to 1.4.

When a weight ratio of the first curing agent to the second curing agent is less than 1:0.5, adhesive strength to a material to be attached may be decreased. When the weight ratio is greater than 1:1.5, elasticity of a coating film may be decreased and durability may be poor.

In addition, the coating layer-forming component may include a curing agent in an amount of 25 to 100 parts by weight, preferably 40 to 80 parts by weight, based on 100 parts by weight of the main resin. When the amount of the curing agent is less than 25 parts by weight, a resin might not be cured, or durability of a formed insulating heat-radiating coating layer may be decreased. In addition, when the amount of the curing agent is greater than 100 parts by weight, a formed insulating heat-radiating coating layer may be cracked or broken.

Next, an insulating heat-radiating filler serving to improve insulating and heat-radiating performance will be described.

A material of the insulating heat-radiating filler is not specifically limited as long as it has both heat-insulating and heat-radiating properties. In addition, the shape and size of the insulating heat-radiating filler are not limited, and the insulating heat-radiating filler may have a porous or non-porous structure depending upon a purpose of use thereof. For example, the insulating heat-radiating filler may include one or more selected from the group consisting of silicon carbide, magnesium oxide, titanium dioxide, aluminum nitride, silicon nitride, boron nitride, aluminum oxide, silica, zinc oxide, barium titanate, strontium titanate, beryllium oxide, manganese oxide, zirconia oxide and boron oxide. However, in terms of excellent insulating and heat-radiating performance, ease of formation of an insulating heat-radiating coating layer, attainment of uniform insulating and heat-radiating performance after formation of the insulating heat-radiating coating layer, attainment of surface quality of the insulating heat-radiating coating layer, and the like, silicon carbide is preferred.

In addition, as the insulating heat-radiating filler, a filler surface-modified with a functional group such as a silane group, an amino group, an amine group, a hydroxyl group, or a carboxyl group may be used. Here, the functional group may be directly bonded to a surface of the filler or indirectly thereto via a C1 to C20 substituted or unsubstituted aliphatic hydrocarbon or a C6 to C14 substituted or unsubstituted aromatic hydrocarbon.

In addition, the insulating heat-radiating filler may be a core-shell type filler wherein a known conductive heat-radiating filler such as a carbon-based filler or a metal constitutes a core and an insulating component encloses the core.

In addition, the insulating heat-radiating filler may have an average particle diameter of 10 nm to 15 μm, preferably 30 nm to 12 μm. When the average particle diameter is less than 10 nm, manufacturing costs may increase and, after being included in an insulating heat-radiating coating layer, the amount of the insulating heat-radiating filler appearing at a surface may increase, which causes a decrease in heat-radiating performance. In addition, when the average particle diameter is greater than 15 μm, uniformity of a surface may be decreased. Meanwhile, to improve the dispersibility of the insulating heat-radiating filler, a ratio of D50 to D97 of the included insulating heat-radiating filler may be 1:4.5 or less, preferably 1:1.2 to 3.5. When a ratio of D50 to D97 is greater than 1:4.5, uniformity of a surface is decreased and dispersibility of the heat-radiating filler is deteriorated, whereby a heat-radiating effect may be non-uniform. In addition, since particles having a relatively large diameter are included, thermal conductivity may be relatively high, but a desired heat-radiating property may not be exhibited. D50 and D97 respectively represent particle diameters of an insulating heat-radiating filler at cumulative degrees of 50% and 97% in a volume cumulative particle size distribution. In particular, in a graph (particle diameter distribution based on volume) wherein a horizontal axis represents a particle diameter and a vertical axis represents a volume cumulative frequency from particles having the smallest diameter, particle diameters corresponding to cumulative volume % values of 50% and 97% from the smallest particle diameter, based on a volume cumulative value (100%) of a total of particles, respectively correspond to D50 and D97. The volume cumulative particle size distribution of the insulating heat-radiating filler may be measured using a laser diffraction/scattering particle size distribution analyzer.

Meanwhile, an average particle diameter of the insulating heat-radiating filler may be changed depending upon a coated thickness of the insulating heat-radiating coating layer. For example, when the insulating heat-radiating coating layer is formed to a thickness of 25 μm, a heat-radiating filler having an average particle diameter of 1 to 7 μm may be used. When the insulating heat-radiating coating layer is formed to a thickness of 35 μm, a heat-radiating filler having an average particle diameter of 8 to 12 μm may be used. However, to further increase dispersibility of a heat-radiating filler in a composition, it is preferred to use a heat-radiating filler satisfying both an average particle diameter range of a heat-radiating filler according to the present invention and a ratio range of D50 to D97 thereof.

The insulating heat-radiating filler may be included in an amount of 25 to 70 parts by weight based on 100 parts by weight of the main resin. To provide further improved properties, the insulating heat-radiating filler may be included, preferably, in an amount 35 to 60 parts by weight. When the insulating heat-radiating filler is included in an amount of less than 25 parts by weight based on 100 parts by weight of the main resin, it may be difficult to exhibit desired heat-radiating performance. In addition, when the insulating heat-radiating filler is included in an amount of greater than 70 parts by weight, adhesion of a formed insulating heat-radiating coating layer is decreased, thereby it is easily peeled off. In addition, hardness of the insulating heat-radiating coating layer increases, whereby it may be easily broken due to physical impact. In addition, since an amount of a heat-radiating filler protruding from a surface of the insulating heat-radiating coating layer increases, surface roughness increases, whereby surface quality of the insulating heat-radiating coating layer may be decreased. In addition, although the insulating heat-radiating filler is further included, the degree of improvement in heat-radiating performance may be slight. In addition, in a process of treating a surface of a substrate with the heat-radiating coating composition to form a thin insulating heat-radiating coating layer, it may be difficult to uniformly treat a surface of a substrate with the composition upon coating by some coating methods, e.g., a spraying method, and a heat-radiating filler may be non-uniformly dispersed when a surface of a substrate is treated with the composition, due to decreased dispersibility of the heat-radiating filler dispersed in a composition. Accordingly, it may be difficult to exhibit uniform insulating and heat-radiating performance over the entire surface of the insulating heat-radiating coating layer.

Next, a property-enhancing component further included in the insulating heat-radiating coating composition will be described.

The property-enhancing component serves to provide a further improved heat-insulating property/heat-radiating property and improve durability by providing an excellent adhesive property when the insulating heat-radiating coating composition according to the present invention is applied on a surface of a substrate.

The property-enhancing component may be a silane-based compound and is not specifically limited so long as it is a silane-based compound used in the art. To provide considerable durability and a heat-radiating property by synergy of desired properties when used with the main resin of the coating layer-forming component and silicon carbide of the insulating heat-radiating filler, the property-enhancing component may include one or more selected from the group consisting of 3-[N-anil-N-(2-aminoethyl)] aminopropyltrimethoxysilane, 3-(N-anil-N-glycidyl)aminopropyltrimethoxysilane, 3-(N-anil-N-methacryloyl]aminopropyltrimethoxysilane, 3-glycidyl oxypropylmethylethoxysilane, N,N-bis[3-(trimethoxysilyl)propyl]methacrylamide, γ-glycidoxytrimethyldimethoxysilane, 3-glycidyloxypropyltrimethoxysilane, 3-glycidyloxypropyltriethoxysilane, 3-glycidyloxypropylmethylmethoxysilane, beta(3, 4-epoxy cyclohexyl)ethyltrimethoxysilane, 3-methacryloxypropyltrimethoxysilane, 3-glycidoxypropylmethyldimethoxysilane, heptadecafluorodecyltrimethoxysilane, 3-methacryloxypropylmethyldimethoxysilane, 3-methacryloxypropyltris(trimethylsiloxy)silane, methyltris(dimethylsiloxy)silane, 3-aminopropyltriepoxy silane, 3-mercaptopropyltrimethoxy silane, and N-(β-aminoethyl)-γ-aminopropyltrimethoxysilane.

In addition, the property-enhancing component may be preferably included in an amount of 0.5 to 20 parts by weight based on 100 parts by weight of the main resin. When the property-enhancing component is included in an amount of less than 0.5 part by weight, desired effects, such as improvements in heat-radiating and adhesiveness, due to inclusion of the property-enhancing component may be not attained. In addition, when the property-enhancing component is included in an amount of greater than 20 parts by weight, the adhesive strength to a surface to be coated may be decreased.

Meanwhile, the insulating heat-radiating coating composition may further include a colorant for minimizing loss of color due to light, air, moisture, or extreme temperatures and a quencher for removing light to exhibit the stability of a coating surface.

The colorant may include one or more colorants selected from the group consisting of talc, zinc oxide, zinc sulfide, a metal oxide-based colorant, a hydroxyl-based colorant, a sulfide-based colorant, an azo-based colorant, a nitro-based colorant, and a phthalocyanine-based colorant. Preferably, the colorant may include talc. In addition, the colorant may be included in an amount of 30 to 60 parts by weight, preferably 35 to 55 parts by weight, based on 100 parts by weight of the main resin, but the present invention is not limited thereto.

In addition, the quencher may include one or more selected from the group consisting of titanium dioxide, aerogel silica, hydrogel silica, PP wax, PE wax, PTFE wax, a urea formaldehyde resin, and a benzoguanamine formaldehyde resin. Preferably, the quencher may include titanium dioxide. In addition, the quencher may be included in an amount of 30 to 60 parts by weight, preferably 35 to 55 parts by weight, based on 100 parts by weight of the main resin, but the present invention is not limited thereto.

Talc, used as a colorant, and titanium dioxide, used as a quencher, may be used as fillers along with the insulating heat-radiating filler to improve withstand voltage characteristics.

Meanwhile, the insulating heat-radiating coating composition may further include a flame retardant for improving flame retardancy of an insulating heat-radiating coating layer.

The flame retardant may be a flame retardant used in the art. For example, the flame retardant may be one or more flame retardants selected from the group consisting of trizinc bis(orthophosphate), triphenyl phosphate, trixylenyl phosphate, tricresyl phosphate, triisophenyl phosphate, tris-choloroethylphosphate, tris-chloropropylphosphate, resorcinol di-phosphate, aromatic polyphosphates, polyphosphoric acid ammonium, and red phosphorous. In addition, the flame retardant may be included in an amount of 10 to 35 parts by weight, preferably 15 to 30 parts by weight, based on 100 parts by weight of the main resin.

Meanwhile, the insulating heat-radiating coating composition may further include a dispersant and solvent for improving the dispersibility of an insulating heat-radiating filler and realizing a uniform insulating heat-radiating coating layer.

The dispersant is a dispersant for an insulating heat-radiating filler and may be a component used in the art. For example, the dispersant may be a silicone-based dispersant, a polyester-based dispersant, a polyphenylene ether-based dispersant, a polyolefin-based dispersant, an acrylonitrilebutadiene-styrene copolymer dispersant, a polyarylate-based dispersant, a polyamide-based dispersant, a polyamideimide-based dispersant, a polyaryl sulfone-based dispersant, a polyetherimide-based dispersant, a polyethersulfone-based dispersant, a polyphenylene sulfide-based dispersant, a polyimide-based dispersant, a polyetherketone-based dispersant, a polybenzoxazole-based dispersant, a polyoxadiazole-based dispersant, a polybenzothiazole-based dispersant, a polybenzimidazole-based dispersant, a polypyridine-based dispersant, a polytriazole-based dispersant, a polypyrrolidine-based dispersant, a polydibenzofuran-based dispersant, a polysulfone-based dispersant, a polyurea-based dispersant, a polyurethane-based dispersant, a polyphosphazen-based dispersant, or the like. These dispersants may be used alone or as a mixture or copolymer of two or more thereof. In addition, for example, the dispersant may be a silicone-based dispersant.

In addition, the dispersant may be included preferably in an amount of 0.5 to 20 parts by weight based on 100 parts by weight of the insulating heat-radiating filler. When the dispersant is included in an amount of less than 0.5 part by weight based on 100 parts by weight of the insulating heat-radiating filler, desired effects may not be exhibited. When the dispersant is included in an amount of greater than 20 parts by weight, the adhesive strength to a substrate may be decreased and pin holes and orange peels may occur on a surface of a coating film.

In addition, the solvent may be selected depending upon a main resin type, a curing agent type, and the like and is not specifically limited in the present invention. The solvent may be any solvent allowing appropriate dissolution of each component. For example, the solvent may be one or more selected from the group consisting of a water-based solvent such as water, an alcohol-based solvent, a ketone-based solvent, an amine-based solvent, an ester-based solvent, an amide-based solvent, a halogenated hydrocarbon-based solvent, an ether-based solvent, and a furan-based solvent.

In addition, the insulating heat-radiating coating composition may include one or more of a leveling agent, a pH adjusting agent, an ion trapping agent, a viscosity adjusting agent, a thixotropic agent, an antioxidant, a heat stabilizer, a photostabilizer, an ultraviolet absorber, a colorant, a dehydrating agent, a flame retardant, an antistatic agent, an antifungal agent, and a preservative. The additive may be any one known in the art and is not specifically limited in the present invention.

The insulating heat-radiating coating composition according to an embodiment of the present invention may have a viscosity of 5 to 600 cps at 25° C. When the insulating heat-radiating coating composition has a viscosity of less than 5 cps, it may be difficult to form an insulating heat-radiating coating layer due to downward flow of a composition and, after formation of the insulating heat-radiating coating layer, adhesion thereof to a surface may be decreased. When the insulating heat-radiating coating composition has a viscosity of greater than 600 cps, it may be difficult to form a thin insulating heat-radiating coating layer, a formed surface may be non-uniform, and a coating process may not be easy. In particular, when coating is performed by a spraying method, it may be more difficult to perform a coating process. In addition, dispersibility of the insulating heat-radiating filler in the insulating heat-radiating coating layer may be decreased.

Meanwhile, the insulating heat-radiating coating composition may further include a UV stabilizer for preventing yellowing by UV.

The UV stabilizer may be included in the insulating heat-radiating coating composition. The UV stabilizer may be any one known in the art. For example, the UV stabilizer may include one or more selected from the group consisting of 2-(2'-hydroxy-3,5'-di(1,1-dimethylbenzil-phenyl)-benzotriazole, 2-(2'-hydroxy-3',5'-di-tert-butylphenyl)-benzotriazole, 2-(2'-hydroxy-3'-tert butyl-5'-methylphenyl)-5-chlorobenzotriazole, 2-(2-hydroxy-5-tert-octylphenyl)-benzotriazole, 2-(5-methyl-2-hydroxy-phenyl)-benzotriazole, 2,6-di-t-butyl-4-methylphenol, tetrakis[methylene-3-(3,5-di-t-butyl-4-hydroxyphenyl)propionate]methane, octadecyl-3,5-di-t-butyl-4-hydroxyhydrocinnamate, 2,2-methylenebis(4-methyl-6-t-butylphenol), tris(2,4-di-t-butylphenyl)-phosphite, bis(2,4-di-t-butyl), pentaerythritol-di-phosphite alkylester phosphites, dilauryl thio-di-propionate, di-stearyl thio-di-propionate, and dimyristyl thio-di-propionate. In addition, the UV stabilizer may be, for example, 2-(2'-hydroxy-3,5'-di(1,1-dimethylbenzil-phenyl)-benzotriazole.

Preferably, the UV stabilizer may be included in an amount of 0.05 to 2 parts by weight based on 100 parts by weight of the main resin. When the UV stabilizer is included in an amount of less than 0.05 part by weight based on 100 parts by weight of the main resin, desired effects may not be exhibited. When the UV stabilizer may be included in an amount of greater than 2 parts by weight, the adhesive strength and impact resistance of the insulating heat-radiating coating layer may be decreased.

Meanwhile, the insulating heat-radiating coating composition may further include an antioxidant for preventing discoloration of a dried coating film, brittleness due to oxidization, and degradation of properties such as adhesive strength.

The antioxidant may be included in the insulating heat-radiating coating composition and may be any one known in the art. For example, the antioxidant may include one or more selected from the group consisting of tri-methylphosphate, tri-phenylphosphate, tris(2,4-di-tert-butylphenyl) phosphate, triethyleneglycol-bis-3-(3-tert-butyl-4-hydroxy-5-methylphenyl)propionate, 1,6-hexane-diol-3(3,5-di-tert-butyl-4-hydroxyphenyl)propionate, pentaerythrityl-tetrakis(3-(3,5-di-tert-butyl-4-hydroxyphenyl)propionate, 2-hydroxybenzophenone, 2-hydroxyphenylbenzothiazole, hindered amines, organic nickel compounds, salicylate, cinnamate derivatives, resorcinol monobenzoate, oxanilide, and p-hydroxybenzoate. In addition, the antioxidant may be, for example, 2-hydroxyphenylbenzothiazole.

Preferably, the antioxidant may be included in an amount of 0.1 to 3 parts by weight based on 100 parts by weight of the main resin. When the antioxidant is included in an amount of less than 0.1 part by weight based on 100 parts by weight of the main resin, discoloration may occur. When the antioxidant is included in an amount of greater than 3 parts by weight, brittleness may occur and adhesive strength maybe decreased.

Meanwhile, a heat-radiating unit including an insulating heat-radiating coating layer with a thickness of 25 μm, formed by treating an aluminum plate with a thickness of 1.5 mm and a width and length of 35 mm×34 mm with the insulating heat-radiating coating composition, followed by curing, may satisfy the following condition (1):

(1) a heat source is placed at the center of a lower part of the heat-radiating unit in a closed system at 25° C. and 50% humidity and, after 90 minutes, temperatures at any 10 points on a circle with a radius of 15 mm centered on the center of an upper surface of the heat-radiating unit are measured. A heat-radiating temperature deviation calculated according to Equation 1 below may be within ±1% at each of the points:

[Equation 1]

$$\text{Heat-radiating temperature error (\%)} = \frac{\text{(Average temperature of any 10 points (°C.))} - \text{(Temperature at each point (°C.))}}{\text{(Average temperature of any 10 points (°C.))}} \times 100 \ (\%)$$

As an error of heat-radiating temperature at each point calculated according to Equation 1 is close to 0%, a heat-radiating filler is more uniformly distributed, and thus, a manufactured heat-radiating unit exhibits a more uniform heat-radiating property.

Since dispersibility of a heat-radiating filler in the insulating heat-radiating coating composition forming an insulating heat-radiating coating layer satisfying Condition (1) is high, a heat-radiating unit, which includes an insulating heat-radiating coating layer formed using the insulating heat-radiating coating composition, may exhibit uniform heat-radiating performance.

Meanwhile, a heat-radiating unit including an insulating heat-radiating coating layer with a thickness of 25 µm, formed by treating an aluminum plate with a thickness of 1.5 mm and a width and length of 35 mm×34 mm with the insulating heat-radiating coating composition, followed by curing, may satisfy the following condition (2):

(2) a 88° C. heat source is placed at the center of a lower part of the heat-radiating unit in a closed system at 25° C. and 50% humidity and, after 90 minutes, a temperature at a point 5 cm away from the center of an upper part of the heat-radiating unit is measured. A heat-radiating efficiency calculated according to Equation 3 below may be 10% or more, preferably 10 to 100%:

[Equation 3]

$$\text{Heat-radiating efficiency (\%)} = \left(\left(\frac{\text{Temperature (\%) at point 5 cm away from center of upper part of heat-radiating unit}}{\text{Temperature (\%) at point 5 cm away from center of upper part of non-coated heat-radiating unit}}\right) - 1\right) \times 100 \ (\%)$$

A high heat radiation efficiency calculated according to Equation (3) means that a heat-radiating property is excellent, that is, heat can be radiated rapidly.

A heat-radiating unit including an insulating heat-radiating coating layer by treating the insulating heat-radiating coating composition and cured to satisfy Condition (2) may exhibit an excellent heat-radiating property, particularly, a heat-dissipating property.

The heat sources used in Conditions (1) and (2) are not specifically limited so long as the temperatures thereof are higher than 25° C. and can be constantly maintained. For example, the heat source may be an LED having a predetermined power consumption.

Meanwhile, the present invention includes a heat-radiating unit 100 including a substrate 10a; and an insulating heat-radiating coating layer 10b formed by treating at least a portion of an outer surface of the substrate 10a with the insulating heat-radiating coating composition according to the present invention and curing the same, as illustrated in FIG. 1. When a heat-radiating unit formed of a metal material is directly brought into contact with a circuit board so as to improve heat-radiating performance, electrical shorts may occur. In the case of a heat-radiating unit including an insulating heat-radiating coating layer formed of the insulating heat-radiating coating composition of the present invention, an electrical short-circuit problem may be addressed and heat generated from the circuit board may be effectively discharged to the outside even when the heat-radiating unit is directly brought into contact with a circuit board.

The substrate 10a is not specifically limited so long as it has mechanical strength sufficient to allow formation of an insulating heat-radiating coating layer after treatment with the insulating heat-radiating coating composition according to the present invention regardless of a heat-radiating property thereof. A material of the substrate 10a may be any one of a metal, a non-metal, and a polymer organic compound. The metal may be molded using any one selected from the group consisting of aluminum, copper, zinc, silver, gold, iron, an oxide thereof, and an alloy thereof.

In addition, the non-metal may be aluminum oxide or a component generally referred to as ceramic. In addition, the polymer organic compound may be a polymer organic compound commonly referred to as plastic such as polyethylene, polypropylene, polystyrene, polyvinyl chloride, an acrylonitrile-butadiene-styrene (ABS) resin, an acrylonitrile-styrene (AN) resin, a methacrylic (PMMA) resin, a polyamide, a polyacetal, a polycarbonate, polyethylene terephthalate (PET), polybutylene terephthalate (PBT), a fluoro resin, a phenoxy resin, a phenol resin (PE), a urea resin (UF), a melamine resin (MF), an unsaturated polyester resin (UP), an epoxy resin, or a polyurethane resin.

Figure 2:
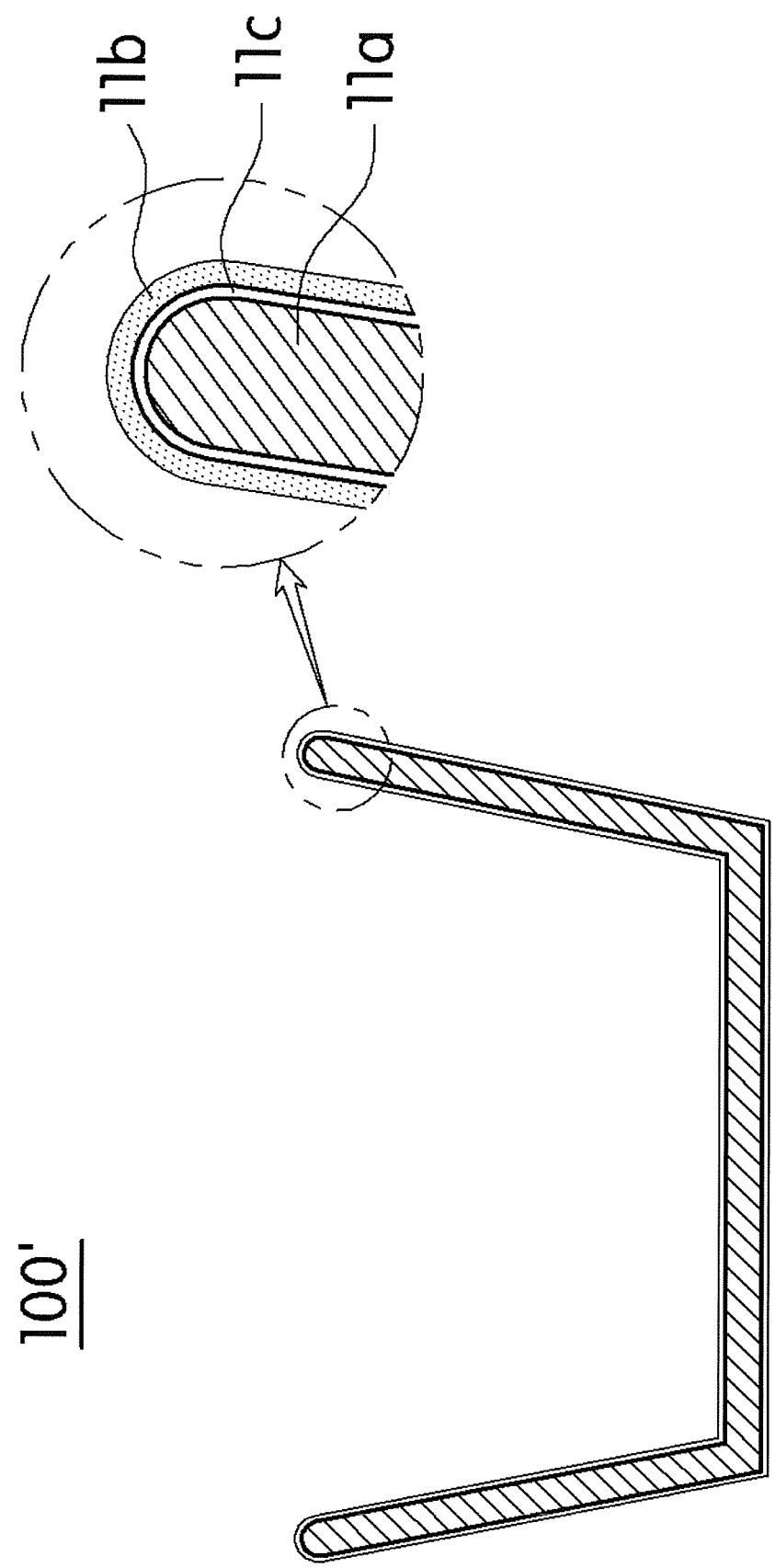

The shape of a substrate 10a is not specifically limited. When the substrate 10a has heat-radiating properties, a plurality of acicular heat-radiating fins 10a1 having a large surface area may be provided to radiate heat to the outside as shown in FIG. 1. Alternatively, a substrate 11a may have a shape wherein both ends of a base plate are bent upward to face each other, thereby functioning as a heat-radiating fin, as shown in FIG. 2. Meanwhile, since insulating heat-radiating coating layers 10b and 11b formed of the insulating heat-radiating coating composition according to an embodiment of the present invention exhibit improved heat-radiating performance, a heat-radiating unit 100', as shown in FIG. 2, exhibits considerably superior heat-radiating performance to the heat-radiating substrate of FIG. 1 having an increased surface area without an insulating heat-radiating coating layer although a heat-radiating fin number of the heat-radiating unit 100' is smaller than that of that of the substrate 11a. Accordingly, although the substrate 10a shown in FIG. 1, which has a structure difficult to mold and may cause an increase in manufacturing time and costs, is not employed, desired heat-radiating performance can be attained.

In addition, even when the substrate 10a has a complicated shape, i.e., includes the plurality of heat-radiating fins 10a1, as shown in FIG. 1, an insulating heat-radiating coating layer has an excellent adhesive property, thus, the insulating heat-radiating coating layer even on a bent or stepped outer surface may not peeled off or cracked.

The thicknesses, lengths, widths, and the like of the substrates 10a and 11a may be variously changed depending upon the size and location of a site to which the heat-radiating units 100 and 100' are applied, and are not specifically limited.

In addition, as shown in FIG. 2, a functional layer 11c between an outer surface of the substrate 11a and the insulating heat-radiating coating layer 11b may be further included. The functional layer 11c may be a separate primer layer for improving an adhesive property of the insulating heat-radiating coating layer 11b or an oxide film formed by surface-modifying an outer surface of the substrate 11a through anodizing to improve heat-radiating performance.

The insulating heat-radiating coating composition according to the present invention may be applied on at least portion of the substrate 10a or 11a, thereby forming an insulating heat-radiating coating layer. Unlike FIGS. 1 and 2, the insulating heat-radiating coating layer may be formed on only a portion of the substrate 10a or 11a. A coated area may be varied depending upon desired heat-radiating performance, and thus, is not specifically limited in the present invention.

The insulating heat-radiating coating layer 10b or 11b is formed by curing the insulating heat-radiating coating composition according to the present invention on an outer surface of a substrate. In particular, the insulating heat-radiating coating layer 10b or 11b may be formed by a known method of applying an insulating heat-radiating coating composition on a substrate. As non-limiting examples, the insulating heat-radiating coating layer 10b or 11b may be applied on various substrates by a method such as spraying, dip coating, silk screening, roll coating, dip coating, or spin coating.

A coating composition may be implemented into an insulating heat-radiating coating layer by thermal and/or optical treatment depending upon a type of main resin, included in a coating layer-forming component, and a type of curing agent used for curing after the coating. Heating temperature, the intensity of light, and/or a treatment time may depend upon a main resin type, a curing agent type, the contents thereof, a coating thickness, and the like. For example, when the aforementioned epoxy resin is included as a main resin, and the first curing agent including an aliphatic polyamine-based curing agent and the second curing agent including one or more selected from the group consisting of an aromatic polyamine-based curing agent, an acid anhydride-based curing agent, and a catalyst-based curing agent are included, surface treatment may be performed at 130° C. to 150° C., which is a temperature lower than a strain point of a substrate, for 1 to 60 minutes. When the surface treatment temperature is less than 130° C., it may be difficult to apply the insulating heat-radiating coating composition on a substrate. When the surface treatment temperature is higher than 150° C., a substrate may be deformed, a heat-radiating layer may be broken, or manufacturing costs may increase. In addition, when the surface treatment time is less than 1 minute, it may be difficult to apply the insulating heat-radiating coating composition on a substrate. When the surface treatment process time is longer than 60 minutes, a manufacturing time of an insulating heat-radiating apparatus is unnecessarily increased. Accordingly, the surface treatment process time is preferably 1 to 60 minutes.

In addition, since the insulating heat-radiating coating composition used in the present invention may be rapidly cured without stickiness within several minutes at room temperature or at 50° C. or below to form a film when exposed to air after being brought into contact with a solid substrate, particularly a metal substrate, the possibility of contamination due to dust and the like in the work place is low and, due to final curing occurring at a relatively low temperature, not only workability is excellent but also it is possible to prevent deformation of a metal substrate during curing.

The formed insulating heat-radiating coating layer 10b or 11b may have a thickness of 15 to 50 μm, more preferably 15 to 45 μm. When the thickness is greater than 50 μm, a boiling phenomenon may occur on a coated surface. When the thickness is less than 15 μm, a heat-radiating property may be decreased.

In addition, the insulating heat-radiating filler may be included in an amount of 10 to 30% by weight, preferably 15 to 25% by weight, based on a total weight of the insulating heat-radiating coating layer 10b or 11b. When the insulating heat-radiating filler is included in an amount of less than 10% by weight in the insulating heat-radiating coating layer, desired heat-radiating performance may not be exhibited. In addition, when the insulating heat-radiating filler is included in an amount of greater than 30% by weight, adhesion of the insulating heat-radiating coating layer may be decreased, thereby it is easily peeled off, and the hardness of the insulating heat-radiating coating layer may increase. Accordingly, the insulating heat-radiating coating layer may be easily broken or crushed by physical impact. In addition, surface roughness increases as the amount of insulating heat-radiating filler protruding from a surface of the insulating heat-radiating coating layer increases, whereby surface quality of the insulating heat-radiating coating layer may be decreased. Further, although the insulating heat-radiating filler is further included, the degree of heat-radiating performance improvement may be slight.

In addition, the insulating heat-radiating unit of the present invention may have a resistance value per unit area of $10^{10}$ to $10^{14}$ Ω/sq. When the insulating heat-radiating unit has a resistance value per unit area of less than $10^{10}$ Ω/sq, the insulating heat-radiating unit exhibits a poor heat-insulating property. Accordingly, it may be difficult to use in applications requiring electrical insulation.

Meanwhile, a relative gain of thermal conductivity according to Equation 2 below of the insulating heat-radiating coating layer may be 200%, preferably greater than 220%:

[Equation 2]

$$\text{Relative gain (\%)} = \frac{\left(\text{Thermal conductivity of insulating heat-radiating coating layer } (Wm^{-1}K^1)\right) - \left(\text{Thermal conductivity of coating layer excluding heat-radiating filler } (Wm^{-1}K^1)\right)}{\left(\text{Thermal conductivity of coating layer excluding heat-radiating filler } (Wm^{-1}K^1)\right)} \times 100 \ (\%)$$

A small relative gain value of thermal conductivity means that an insulating heat-radiating coating layer including a heat-radiating filler has less thermal conductivity improvement, compared to a coating layer excluding the heat-radiating filler, and a large relative gain means that an insulating heat-radiating coating layer including a heat-radiating filler has superior thermal conductivity improvement to a coating layer excluding a heat-radiating filler.

When the relative gain of thermal conductivity is less than 200%, desired heat-radiating performance may not be exhibited.

Meanwhile, the present invention includes an insulating heat-radiating circuit board including an insulating heat-radiating coating layer formed by treating at least a portion of an outer surface of a circuit board on which an element is mounted with the insulating heat-radiating coating composition according to the present invention, followed by curing.

Figure 3:
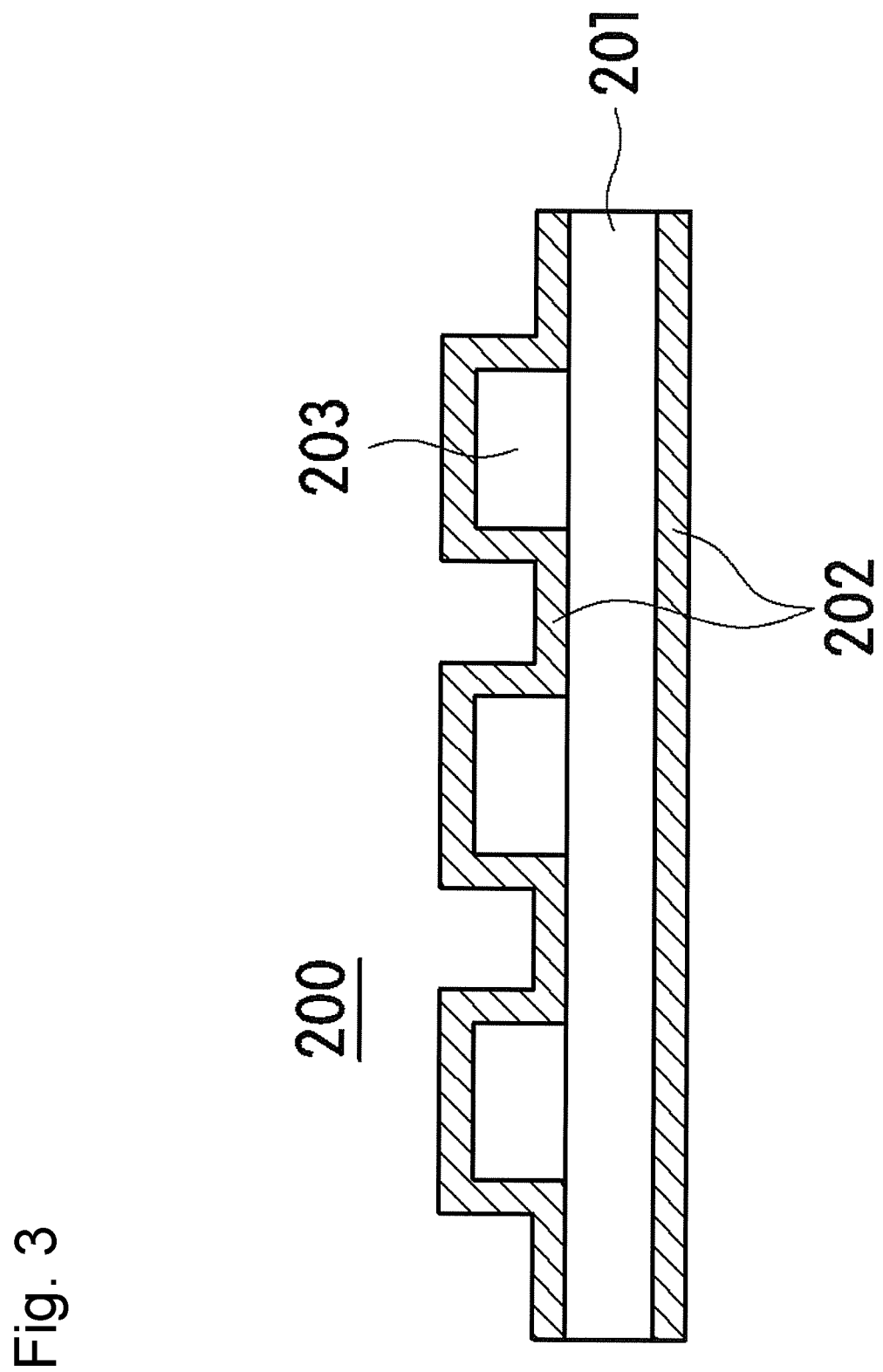
FIG. 3 illustrates a sectional view of an insulating heat-radiating circuit board including an insulating heat-radiating coating layer according to an embodiment of the present invention.

In particular, as shown in FIG. 3, an insulating heat-radiating circuit board 200 may include a substrate 201 and a plurality of elements 203 mounted on the substrate 201. An insulating heat-radiating coating layer 202 may be formed on upper and lower surfaces of the substrate 201 and on the elements 203.

The element may be a known element mounted on a circuit board in an electronic device such as a driving chip. In addition, the substrate may be a known circuit board provided in electronic devices and may be, for example, a PCB or an FPCB. The size and thickness of the substrate may be changed according to an internal design of an electronic device to be implemented, and the present invention is not particularly limited thereto.

In addition, the present invention includes an insulating heat-radiating component for lighting, wherein at least a portion of an outer surface of the insulating heat-radiating component includes an insulating heat-radiating coating layer formed by treatment of the insulating heat-radiating coating composition according to the present invention, followed by curing.

Figure 4:
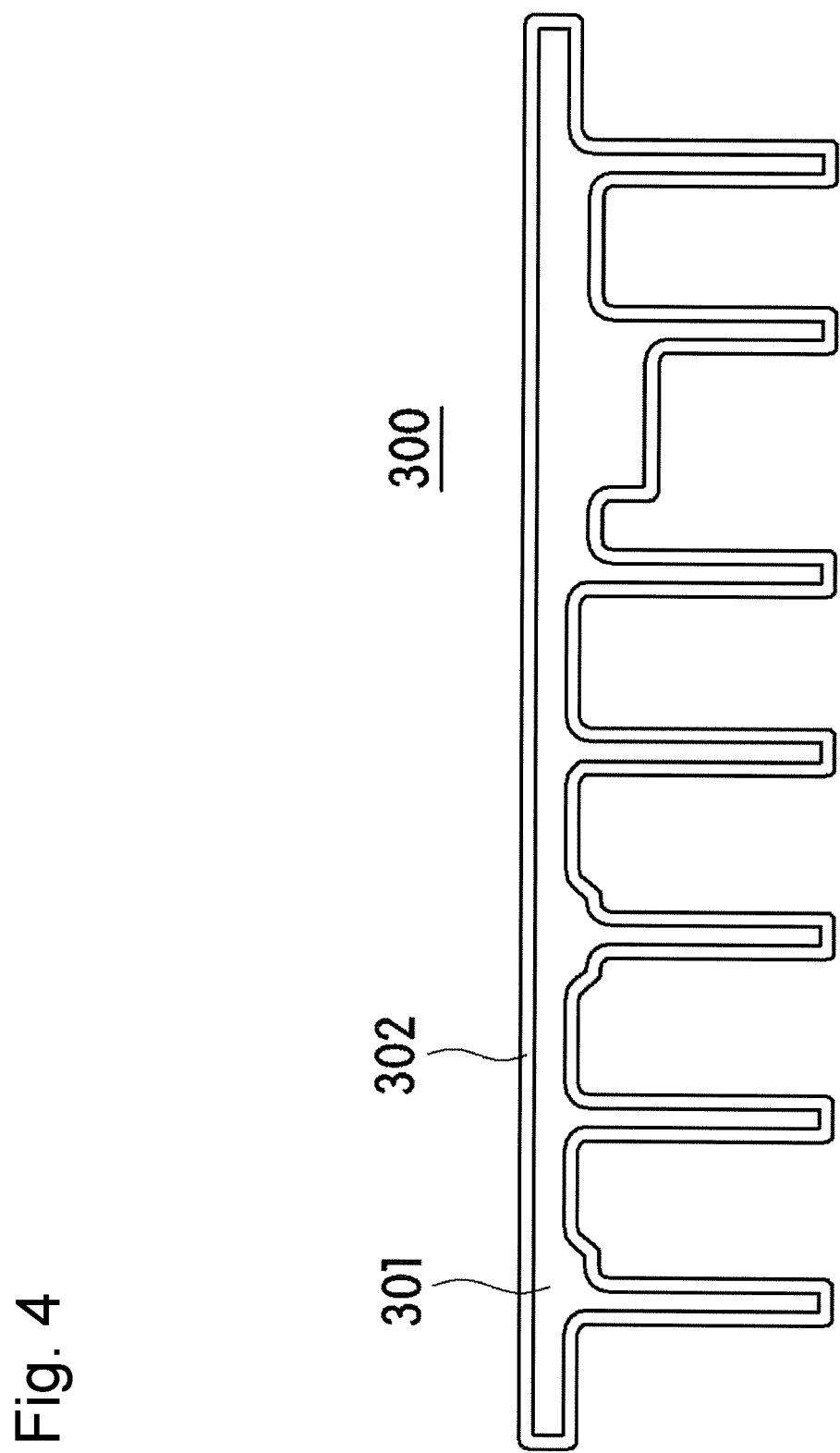
FIG. 4 illustrates a sectional view of a heat sink for LED lighting including an insulating heat-radiating coating layer according to an embodiment of the present invention.

For example, the insulating heat-radiating component for lighting may be an insulating heat-radiating heat sink for lighting. In particular, as shown in FIG. 4, an insulating heat-radiating heat sink 300 for lighting may include a heat sink 301 and an insulating heat-radiating coating layer 302 formed on an entire or partial surface of an outer surface of the heat sink 301.

The heat sink 301 may be a known heat sink provided in lighting. The material, size, thickness, and shape of the heat sink may be changed according to the use, shape, and internal design of lighting, and are not specifically limited in the present invention.

Meanwhile, the insulating heat-radiating coating composition according to the present invention may be applied to, in addition to the aforementioned heat-radiating unit, circuit board, and component for lighting, electronic parts such as a mobile device, a TV, a wearable device and a flexible device, an LED lamp, automobile components including an electronic control unit (ECU), an EV battery, and an inverter, telecommunication devices including RF equipment, digital equipment, server equipment and a set-up box, apparatuses including a network apparatus, a solar panel, an LED, and an Al/AlN printed circuit board (PCB), components for lighting including an illumination case and a socket, and the like. For example, an insulating heat-radiating coating layer formed by curing the insulating heat-radiating coating composition according to the present invention may be applied to at least a portion of an outer surface of one or more selected from the group consisting of an insulating heat-radiating bus bar for high-voltage switching EV relays, an insulating heat-radiating case for high-voltage switching EV relays, an insulating heat-radiating DC-DC converter for automobiles, an automotive engine cooling apparatus, an automotive LED head lamp, and a PTC heater.

For example, the component for automobiles may be an insulating heat-radiating bus bar for high-voltage switching EV relays, which includes an insulating heat-radiating coating layer formed by treating at least a portion of an outer surface thereof with the insulating heat-radiating coating composition according to the present invention and curing.

The bus bar for high-voltage EV relays may be a known bus bar for high-voltage EV relays, which is generally used in the art. The material, size, thickness, and shape of the bus bar may be changed according to an internal design considering desired input voltage and/or output voltage of high-voltage EV relays, and are not specifically limited in the present invention.

In addition, the component for automobiles may be an insulating heat-radiating case for high-voltage switching EV relays including an insulating heat-radiating coating layer formed by treating at least a portion of an outer surface thereof with the insulating heat-radiating coating composition according to the present invention and curing.

The case for high-voltage switching EV relays may be a known case for high-voltage EV relays, which is generally used in the art. The aforementioned bus bar for high-voltage EV relays may be included in the case for high-voltage switching EV relays. The material, size, thickness, and shape of the case may be changed according to an internal design, such as the shape and number, of bus bars located inside a high-voltage EV relay to be implemented, and are not specifically limited in the present invention.

In addition, the component for automobiles may be an insulating heat-radiating DC-DC converter including an insulating heat-radiating coating layer formed by treating at least a portion of an outer surface thereof with the insulating heat-radiating coating composition according to the present invention and curing.

The DC-DC converter serves to convert a DC power source at a specific voltage to a DC power source at a different voltage and may be a known DC-DC converter commonly used in the art. The size and shape of the DC-DC converter may be changed according to an internal design of an apparatus to be implemented and are not specifically limited in the present invention.

In addition, the component for automobiles may be an insulating heat-radiating engine cooling apparatus including an insulating heat-radiating coating layer formed by treating at least a portion of an outer surface thereof with the insulating heat-radiating coating composition according to the present invention and curing.

For example, the insulating heat-radiating coating layer may be formed on a portion or the entirety of a radiator included in the insulating heat-radiating engine cooling apparatus. The radiator may be a known radiator commonly used in the art. The material, size, and shape of the radiator may be changed according to an internal design of an engine cooling apparatus to be implemented and are not specifically limited in the present invention.

In addition, the component for automobiles may be an insulating heat-radiating LED head lamp including an insulating heat-radiating coating layer formed by treating at least a portion of an outer surface thereof with the insulating heat-radiating coating composition according to the present invention and curing.

Since at least a portion of an outer surface of the LED head lamp includes an insulating heat-radiating coating layer, insulating and heat-radiating properties may be remarkably improved and the LED head lamp may be lightened. The LED head lamp may be a known LED head lamp commonly used in the art. The material, size, and shape of the LED head lamp may be changed according to the design of an automobile to be implemented and/or an internal design of an LED head lamp, and are not specifically limited in the present invention.

In addition, the component for automobiles may be an insulating heat-radiating PTC heater for electric automobiles including an insulating heat-radiating coating layer formed by treating at least a portion of an outer surface thereof with the insulating heat-radiating coating composition according to the present invention and curing.

The PTC heater may include a PTC fin. The insulating heat-radiating coating layer may be formed on a portion or the entirety of the PTC, whereby heat-radiating efficiency may be improved and power consumption of an electric automobile may be reduced. The PTC fin may be a known PTC fin commonly used in the art. The material, size, and shape of the PTC fin may be changed according to an internal design of a PTC heater to be implemented and are not specifically limited in the present invention.

Meanwhile, the heat-radiating coating composition for forming an insulating heat-radiating coating layer of the present invention can provide excellent adhesion of an insulating heat-radiating coating layer to a substrate, improved moisture resistance and weather resistance, and improved wettability of an insulating heat-radiating filler, prevent a decrease in viscosity during compounding, and increase ductility of a substrate surface on which an insulating heat-radiating coating layer is formed. In addition, since the heat-radiating coating composition can exhibit excellent heat-radiating and insulating properties and excellent resistance against an organic solvent, does not exhibit discoloration during curing, and allows easy control of heat conductivity, an insulating heat-radiating unit including an insulating heat-radiating coating layer implemented using the heat-radiating coating composition can continuously exhibit improved properties. In addition, since the heat-radiating filler dispersed in the insulating heat-radiating coating layer has excellent dispersibility, uniform insulating and heat-radiating performances can be exhibited. The heat-radiating coating composition of the present invention can be broadly applied to all industries such as a circuit board on which electric and electronic components requiring both heat-insulating and heat-radiating properties are mounted, lighting devices such as an LED lamp, electrical and electronic devices such as a display device, the automotive industry, energy industry, and aerospace industry.

MODE FOR CARRYING OUT THE INVENTION

The present invention will now be described more specifically with reference to the following examples. However, the following examples should not be understood as limiting the scope of the present invention, but should be understood as being provided to facilitate understanding of the present invention.

Example 1

To prepare a coating layer-forming component, 60 parts by weight of a curing agent including polyethylene a first curing agent, polyamine, as and 2,4,6-tris[N,N-dimethylamino]methyl]phenol, as a second curing agent, in a weight ratio of 1:1; 47 parts by weight of silicon carbide having an average particle diameter of 5 μm and a D50 to D97 ratio of 1:1.6; 3 parts by weight of an epoxy-based silane compound (Shanghai Tech Polymer Technology, Tech-7130) as a property-enhancing component; 44 parts by weight of talc as a colorant; 44 parts by weight of titanium dioxide as a quencher; 22 parts by weight of trizinc bis(orthophosphate) as a flame retardant; 0.5 part by weight of 2-(2'-hydroxy-3, 5'-di(1,1-dimethylbenzil-phenyl)-benzotriazole as a UV stabilizer; 1 part by weight of 2-hydroxyphenylbenzothiazole as an antioxidant; 5 parts by weight of a dispersant (condensate of isobutylaldehyde and urea); 13 parts by weight of 1-butanol as a solvent; 13 parts by weight of n-butyl acetate; 13 parts by weight of 2-methoxy-1-methylethyl acetate; 9 parts by weight of methylethylketone; 37 parts by weight of ethyl acetate; 9 parts by weight of toluene; 43 parts by weight of 4-methyl-2-pentanone; and 103 parts by weight of xylene were mixed and stirred based on 100 parts by weight of a compound represented by Formula 1 below as a main resin. After stirring, bubbles in the resultant mixture were removed, and an insulating heat-radiating coating composition, as shown in Table 1 below, was prepared to have a final viscosity of 100 to 130 cps at 25° C. The prepared insulating heat-radiating coating composition was stored at 5° C.

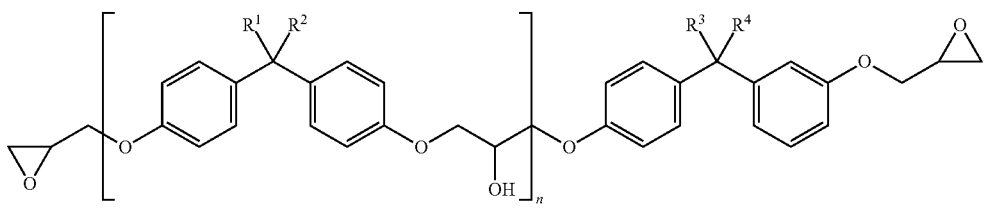

[Formula 1]

wherein $R^1$ to $R^4$ are each a methyl group, and n is a rational number such that a weight average molecular weight of the compound represented by Formula 1 is 2000.

Examples 2 to 21

Insulating heat-radiating coating compositions were prepared in the same manner as in Example 1, except that an average particle diameter and particle size distribution of an insulating heat-radiating filler, a weight ratio of a curing agent, and a molecular weight of a main resin were changed as summarized in Tables 1, 2, or 3 below.

Comparative Examples 1 to 3

Insulating heat-radiating coating compositions were prepared in the same manner as in Example 1, except that the content of an insulating heat-radiating filler and the like were changed as summarized in Table 4 below.

Experimental Example 1

Each of the heat-radiating coating compositions prepared according to the examples and the comparative examples was spray-coated on an entire surface of a substrate with a thickness of 1.5 mm and a width and length of 35 mm×34 mm and made of aluminum (Al 1050) to a final thickness of 25 μm, followed by thermal treatment at 150° C. for 10 minutes. As a result, a heat-radiating unit on which an insulating heat-radiating coating layer had been formed was manufactured. The properties of the heat-radiating unit were evaluated as follows. Results are summarized in Tables 1 to 4.

1. Thermal Conductivity Evaluation

After placing a heat-radiating unit in the center of an acrylic chamber having a width, length and height of 32 cm×30 cm×30 cm, the temperature inside the chamber and the temperature inside the heat-radiating unit were adjusted to 25±0.2° C. Next, test specimens were manufactured by attaching a D50 to D97 ratio of 1:1.6, as a heat source, to the heat-radiating unit with a thermal conductivity tape (TIM: 1 W/mk). Thermal conductivity was evaluated by measuring the temperature of the heat-radiating unit after generating heat by applying an input power of 2.1 W (DC 3.9V, 0.53 A) to the heat source of the manufactured specimen and allowing to stand for 90 minutes. In particular, thermal conductivity was calculated based on a temperature of a substrate excluding a heat-radiating coating layer according to Equation 4 below, which was measured under the same conditions:

[Equation 4]
$$\text{Thermal conductivity (\%)} = \left\{1 - \left(\frac{\text{Temperature (° C.) of test specimen}}{\text{Temperature (° C.) of uncoated substrate}}\right)\right\} \times 100\ (\%)$$

2. Heat Radiation Evaluation

After placing a heat-radiating unit in the center of an acrylic chamber having a width, length and height of 32 cm×30 cm×30 cm, the temperature inside the chamber and the temperature inside heat-radiating unit were adjusted to 25±0.2° C. Next, test specimens were manufactured by attaching an LED having a width and length of 20 mm×20 mm, as a heat source, to the heat-radiating unit with a thermal conductivity tape (TIM: 1 W/mk). Heat-radiating efficiency was evaluated by measuring a temperature at a point 5 cm away from the center of an upper part of the heat-radiating unit after generating heat by applying an input power of 2.1 W (DC 3.9V, 0.53 A) to the heat source of the manufactured specimen and allowing to stand for 90 minutes. In particular, heat-radiating efficiency was calculated based on a temperature of a substrate excluding an insulating heat-radiating coating layer according to Equation 3 below, which was measured under the same conditions:

[Equation 3]
$$\text{Heat-radiating efficiency (\%)} = \left\{\left(\frac{\text{Temperature (\%) at point 5 cm away from center of upper part of heat-radiating unit}}{\text{Temperature (\%) at point 5 cm away from center of upper part of non-coated heat-radiating unit}}\right) - 1\right\} \times 100\ (\%)$$

3. Evaluation of Uniformity of Heat-Radiating Performance

After placing a heat-radiating unit in the center of an acrylic chamber having a width, length and height of 32 cm×30 cm×30 cm, the temperature inside the chamber and the temperature inside heat-radiating unit were adjusted to 25±0.2° C. and the humidity inside the chamber was adjusted to 50%. Next, test specimens were manufactured by attaching an LED having a width and length of 20 mm×20 mm, as a heat source, to the heat-radiating unit with a thermal conductivity tape (TIM: 1 W/mk). After generating heat by applying an input power of 2.1 W (DC 3.9V, 0.53 A) to the heat source of the manufactured specimen and allowing to stand for 90 minutes, temperatures at any 10 points on a circle with a radius of 15 mm centered on the center of an upper surface of the heat-radiating unit were measured. A heat-radiating temperature deviation was calculated according to Equation 1 below. A smaller error can be interpreted as denoting more uniform heat-radiating performance and higher dispersibility of the heat-radiating filler in the insulating heat-radiating coating layer. Maximum values among heat-radiating temperature deviations are summarized in Tables 1 to 4 below.

[Equation 1]
$$\text{Heat-radiating temperature error (\%)} = \frac{(\text{Average temperature of any 10 points (° C.)}) - (\text{Temperature at each point (° C.)})}{(\text{Average temperature of any 10 points (° C.)})} \times 100\ (\%)$$

4. Durability Evaluation

A heat-radiating unit was placed in a 60° C. chamber having a relative humidity of 90%. After 480 hours, a surface state of the heat-radiating unit was observed with the naked eye. Whether the insulating heat-radiating coating layer was cracked or peeled off (lifted) was observed. When there was no abnormality, it was represented by 0, and when an abnormality occurred, it was indicated by x.

5. Adhesive Property Evaluation

The specimens which had been subjected to the durability evaluation were cross-cut at intervals of 1 mm with a knife. Next, a scotch tape was attached to each of the cut surfaces and pulled at an angle of 60° to observe whether the insulating heat-radiating coating layer was peeled off. Evaluation was performed according to ISO 2409 (5B: 0%, 4B: 5% or less, 3B: 5 to 15%, 2B: 15 to 35%, 1B: 35 to 65%, 0B: 65% or more).

6. Surface Quality Evaluation

To confirm surface quality of the heat-radiating units, it was checked whether there was a rugged or rough feeling upon touching the surfaces with the hand. The case wherein there was a smooth feeling was denoted by 5, the case wherein a rough area occupied 2% or less of an entire outer surface area of the heat-radiating unit was denoted by 4, the case wherein a rough area occupied greater than 2% and 5% or less of the entire outer surface area was denoted by 3, the case wherein a rough area occupied greater than 5% and 10% or less of the entire outer surface area was denoted by 2, the case wherein a rough area occupied greater than 10% and 20% or less of the entire outer surface area was denoted by 1, and the case wherein a rough area occupied greater than 20% of the entire outer surface area was denoted by 0.

TABLE 1

| | | Classification | | | | | | |
|---|---|---|---|---|---|---|---|---|
| | | Example 1 | Example 2 | Example 3 | Example 4 | Example 5 | Example 6 | Example 7 |
| Coating layer-forming component | Main resin (weight average molecular weight) | 2000 | 2000 | 2000 | 310 | 570 | 3900 | 4650 |
| | Content of curing agent (parts by weight) | 60 | 60 | 60 | 60 | 60 | 60 | 60 |
| | Weight ratio of first curing agent to second curing agent | 1:1 | 1:1 | 1:1 | 1:1 | 1:1 | 1:1 | 1:1 |
| Insulating heat-radiating filler | Content (parts by weight) | 47 | 35 | 60 | 47 | 47 | 47 | 47 |
| | Average particle diameter (μm) | 5 | 5 | 5 | 5 | 5 | 5 | 5 |
| | Ratio of D50 to D97 | 1:1.6 | 1:1.6 | 1:1.6 | 1:1.6 | 1:1.6 | 1:1.6 | 1:1.6 |
| Heat-radiating unit | Thickness (μm) of insulating heat-radiating coating layer | 25 | 25 | 25 | 25 | 25 | 25 | 25 |
| | Thermal conductivity (%) | 18.27 | 17.65 | 18.34 | 16.91 | 17.02 | 17.13 | 16.54 |
| | Heat-radiating efficiency (%) | 90 | 81 | 96 | 86 | 88 | 88 | 87 |
| | Heat-radiating temperature deviation (%) | 0.5 | 0.6 | 0.4 | 0.3 | 0.4 | 0.9 | 4.1 |
| | Adhesive property | 5B | 5B | 5B | 0B | 4B | 5B | 5B |
| | Durability | ○ | ○ | ○ | x | ○ | ○ | ○ |
| | Surface quality | 5 | 5 | 5 | 5 | 5 | 5 | 5 |

TABLE 2

| | | Classification | | | | | | |
|---|---|---|---|---|---|---|---|---|
| | | Example 8 | Example 9 | Example 10 | Example 11 | Example 12 | Example 13 | Example 14 |
| Coating layer-forming component | Main resin (weight average molecular weight) | 2000 | 2000 | 2000 | 2000 | 2000 | 2000 | 2000 |
| | Curing agent content (parts by weight) | 15 | 30 | 95 | 110 | 60 | 60 | 60 |
| | Weight ratio of first curing agent to second curing agent | 1:1 | 1:1 | 1:1 | 1:1 | 1:0.2 | 1:0.6 | 1:1.4 |
| Insulating heat-radiating filler | Content (parts by weight) | 47 | 47 | 47 | 47 | 47 | 47 | 47 |
| | Average particle diameter (μm) | 5 | 5 | 5 | 5 | 5 | 5 | 5 |
| | Ratio of D50 to D97 | 1:1.6 | 1:1.6 | 1:1.6 | 1:1.6 | 1:1.6 | 1:1.6 | 1:1.6 |
| Heat-radiating unit | Thickness (μm) of insulating heat-radiating coating layer | 25 | 25 | 25 | 25 | 25 | 25 | 25 |
| | Thermal conductivity (%) | 16.22 | 17.39 | 17.12 | 14.59 | 16.94 | 17.72 | 17.63 |
| | Heat-radiating efficiency (%) | 88 | 88 | 87 | 87 | 86 | 88 | 89 |
| | Heat-radiating temperature deviation (%) | 0.5 | 0.5 | 0.5 | 0.5 | 0.4 | 0.5 | 0.5 |
| | Adhesive property | 0B | 4B | 4B | 2B | 0B | 5B | 5B |
| | Durability | x | ○ | ○ | x | x | ○ | ○ |
| | Surface quality | 2 | 5 | 5 | 1 | 5 | 5 | 5 |

TABLE 3

| | Classification | Example 15 | Example 16 | Example 17 | Example 18 | Example 19 | Example 20 | Example 21 |
|---|---|---|---|---|---|---|---|---|
| Coating layer-forming component | Main resin (weight average molecular weight) | 2000 | 2000 | 2000 | 2000 | 2000 | 2000 | 2000 |
| | Curing agent content (parts by weight) | 60 | 60 | 60 | 60 | 60 | 60 | 60 |
| | Weight ratio of first curing agent to second curing agent | 1:2 | 1:1 | 1:1 | 1:1 | 1:1 | 1:1 | 1:1 |
| Insulating heat-radiating filler | Content (parts by weight) | 47 | 47 | 47 | 47 | 47 | 47 | 47 |
| | Average particle diameter (μm) | 5 | 0.005 | 0.42 | 10 | 20 | 3 | 5 |
| | Ratio of D50 to D97 | 1:1.6 | 1:2.41 | 1:2.08 | 1:1.51 | 1:1.93 | 1:3.08 | 1:4.96 |
| Heat-radiating unit | Thickness (μm) of insulating heat-radiating coating layer | 25 | 25 | 25 | 25 | 25 | 25 | 25 |
| | Thermal conductivity (%) | 17.01 | 12.11 | 17.63 | 17.92 | 17.19 | 17.88 | 18.31 |
| | Heat-radiating efficiency (%) | 88 | 7 | 88 | 91 | 90 | 81 | 39 |
| | Heat-radiating temperature deviation (%) | 0.5 | 0.5 | 0.5 | 0.4 | 2.8 | 0.8 | 3.9 |
| | Adhesive property | 2B | 3B | 5B | 5B | 3B | 4B | 2B |
| | Durability | x | ○ | ○ | ○ | ○ | ○ | ○ |
| | Surface quality | 5 | 5 | 5 | 4 | 0 | 4 | 3 |

TABLE 4

| | Classification | Comparative Example1 | Comparative Example2 | Comparative Example3[1)] |
|---|---|---|---|---|
| Coating layer-forming component | Main resin (weight average molecular weight) | 2000 | 2000 | 2000 |
| | Curing agent content (parts by weight) | 60 | 60 | 60 |
| | Weight ratio of first curing agent to second curing agent | 1:1 | 1:1 | 1:1 |
| Insulating heat-radiating filler | Content (parts by weight) | 15 | 80 | — |
| | Average particle diameter (μm) | 5 | 5 | — |
| Heat-radiating unit | Ratio of D50 to D97 | 1:1.6 | 1:1.6 | — |
| | Thickness (μm) of insulating heat-radiating coating layer | 25 | 25 | 25 |
| | Thermal conductivity (%) | 14.62 | 18.36 | 4.76 |
| | Heat-radiating efficiency (%) | 8 | 98 | 2 |
| | Heat-radiating temperature deviation (%) | 5.3 | 1.0 | 0 |
| | Adhesive property | 5B | 3.8 | 5B |
| | Durability | ○ | x | ○ |
| | Surface quality | 5 | 1 | 5 |

[1)]Composition of Comparative Example 3 excluding a heat-radiating filler.

As shown in Tables 1 to 4, it was confirmed that, in the case of Examples 1, 5, and 6 wherein the weight average molecular weight of the main resin was within the preferred range of the present invention, adhesiveness, durability, and uniformity of heat-radiating performance were all attained, compared to Examples 4 and 7 not satisfying the preferred range.

In addition, it was confirmed that, in the case of Examples 1, 9, and 10 wherein the content of the curing agent was within the preferred range of the present invention, thermal conductivity, durability, and adhesiveness were all attained, compared to Examples 8 and Example 11 not satisfying the preferred range.

In addition, it was confirmed that, in the case of Examples 1, 13, and 14 wherein a weight ratio of the first curing agent to the second curing agent was within the preferred range of the present invention, both adhesiveness and durability were attained, compared to Examples 12 and 15 not satisfying the preferred range.

In addition, it was confirmed that, in the case of Examples 1, 17, and 18 wherein the average particle diameter of the insulating heat-radiating filler was within the preferred range of the present invention, heat-radiating efficiency, thermal conductivity, and surface quality were all attained, compared to Examples 16 and 19 not satisfying the preferred range.

In addition, it was confirmed that, in the case of Examples 1 and 20 wherein a ratio of D50 to D97 was within the preferred range of the present invention, dispersibility, surface quality, heat-radiating efficiency, and adhesiveness were all attained, compared to Example 21 not satisfying the preferred range.

In addition, it was confirmed that, in the case of Examples 1, 2, and 3 wherein the content of the heat-radiating filler was within the preferred range of the present invention, both heat-radiating performance and surface quality were remarkably excellent, compared to Comparative Examples 1 and 2 not satisfying the preferred range.

Further, it was confirmed that, in the case of Comparative Example 3 excluding the heat-radiating filler, a heat-radiating property was considerably low, compared to Example 1 including the heat-radiating filler.

Experimental Example 2

The heat-radiating unit (Manufacturing Example 1) manufactured using the composition of Example 1 and the heat-radiating unit (Comparative Manufacturing Example 3) manufactured using the composition of Comparative Example 3 were subjected to relative gain evaluation of thermal conductivity. In particular, thermal conductivity was measured by a steady state heat flow method, and a relative gain of the thermal conductivity was evaluated according to Equation 2 below. Results are summarized in Table 5 below.

[Equation 2]

$$\text{Relative gain (\%)} = \frac{\left(\text{Thermal conductivity of insulating heat-radiating coating layer } (\text{Wm}^{-1}K^1)\right) - \left(\text{Thermal conductivity of coating layer excluding heat-radiating filler } (\text{Wm}^{-1}K^1)\right)}{\left(\text{Thermal conductivity of coating layer excluding heat-radiating filler } (\text{Wm}^{-1}K^1)\right)} \times 100 \ (\%)$$

TABLE 5

| Classification | Manufacturing Example 1 | Comparative Manufacturing Example 3 |
|---|---|---|
| Thermal conductivity (W/m · K) | 0.58 | 0.12 |
| Relative gain (%) of thermal conductivity | | 383.3 |

As shown in Table 5, it was confirmed that, in the case of Manufacturing Example 1 according to the present invention, wherein the insulating heat-radiating filler was included, thermal conductivity was significantly high, and thus, excellent heat-radiating performance was exhibited, compared to Comparative Manufacturing Example 3 excluding the insulating heat-radiating filler.

Experimental Example 3

Resistance values of the heat-radiating units (Manufacturing Examples 1, 2 and 3) manufactured using the compositions of Examples 1, 2, and 3 and the heat-radiating unit (Comparative Manufacturing Example 2) manufactured using the composition of Comparative Example 2 were measured. In particular, resistance values were measured by 4-point-probe method. Results are summarized in Table 6 below.

TABLE 6

| Classification | Manufacturing Example 1 | Manufacturing Example 2 | Manufacturing Example 3 | Comparative Manufacturing Example 2 |
|---|---|---|---|---|
| Resistance value (Ω/sq.) | $1.3 \times 10^{12}$ | $7.1 \times 10^{13}$ | $9.7 \times 10^{10}$ | $7.1 \times 10^{9}$ |

From Table 6, it can be confirmed that, in the case of Manufacturing Examples 1 to 3 according to the present invention, a significantly high resistance value is exhibited, and thus, an excellent heat-insulating property is exhibited, compared to Comparative Manufacturing Example 2 wherein an insulating heat-radiating filler is included in a greater amount than the content of the present invention.

While the present invention has been described with reference to exemplary embodiments thereof, it is to be understood that the scope of the present invention is not limited to the exemplary embodiments set forth herein. Those skilled in the art of the present invention who understand the teachings of the present invention will readily be able to suggest other embodiments by adding, changing, deleting, etc. elements within the scope of the present invention.

The invention claimed is:

1. An insulating heat-radiating coating composition, comprising:
   a coating layer-forming component comprising a main resin;
   an insulating heat-radiating filler comprised in an amount of 35 to 60 parts by weight based on 100 parts by weight of the main resin, and
   a dispersant comprised in an amount 0.5 to 20 parts by weight based on 100 parts by weight of the insulating heat-radiating filler,
   wherein the insulating heat-radiating filler has an average particle diameter of 10 nm to 15 μm, and in the insulating heat-radiating filler, a ratio of D50 to D97 is 1:4.5 or less, and
   wherein the main resin comprises a compound represented by Formula 1:

[Formula 1]

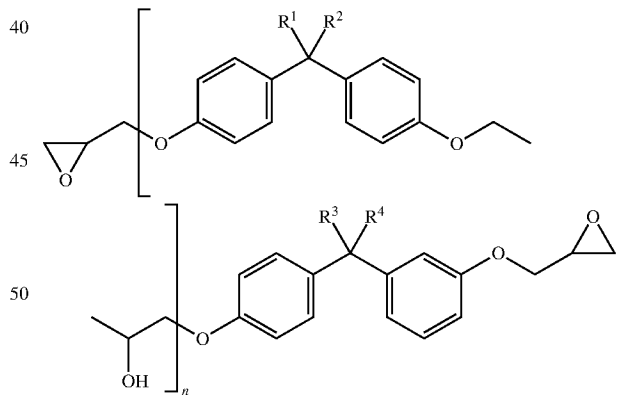

wherein $R^1$ and $R^2$ are each independently a hydrogen atom, a C1 to C5 straight-chain alkyl group, or a C3 to C5 branched alkyl group, $R^3$ and $R^4$ are each independently a hydrogen atom, a C1 to C5 straight-chain alkyl group, or a C3 to C5 branched alkyl group, and n is a rational number such that the compound represented by Formula 1 has a weight average molecular weight of 450 to 3,900.

2. The insulating heat-radiating coating composition according to claim 1, wherein the coating layer-forming component further comprises 25 to 100 parts by weight of a curing agent based on 100 parts by weight of the main resin.

3. The insulating heat-radiating coating composition according to claim 2, wherein the curing agent comprises one or more selected from the group consisting of an aliphatic polyamine-based curing agent, an aromatic polyamine-based curing agent, an acid anhydride-based curing agent, and a catalyst-based curing agent.

4. The insulating heat-radiating coating composition according to claim 2, wherein the curing agent comprises a first curing agent comprising an aliphatic polyamine-based curing agent and a second curing agent comprising one or more selected from the group consisting of an aromatic polyamine-based curing agent, an acid anhydride-based curing agent, and a catalyst-based curing agent in a weight ratio of 1:0.5 to 1:1.5.

5. The insulating heat-radiating coating composition according to claim 1, wherein the insulating heat-radiating coating composition further comprises 0.5 to 20 parts by weight of a property-enhancing component for improving adhesion based on 100 parts by weight of the main resin.

6. The insulating heat-radiating coating composition according to claim 1, wherein the insulating heat-radiating coating composition further comprises, based on 100 parts by weight of the main resin,
- 30 to 60 parts by weight of one or more colorants selected from the group consisting of talc, zinc sulfide, a metal oxide-based colorant, a hydroxyl-based colorant, a sulfide-based colorant, an azo-based colorant, a nitro-based colorant, and a phthalocyanine-based colorant; and
- 30 to 60 parts by weight of one or more quenchers selected from the group consisting of titanium dioxide, aerogel silica, hydrogel silica, PP (PolyPropylene) wax, PE (PolyEthylene) wax, PTFE (PolyTetraFluoroEthylene) wax, a urea formaldehyde resin, and a benzoguanamine formaldehyde resin.

7. The insulating heat-radiating coating composition according to claim 1, wherein the insulating heat-radiating coating composition comprises 10 to 35 parts by weight of one or more flame retardants selected from the group consisting of trizinc bis(orthophosphate), triphenyl phosphate, trixylenyl phosphate, tricresyl phosphate, tris-chloroethylphosphate, tris-chloropropylphosphate, resorcinol diphosphate, aromatic polyphosphates, polyphosphoric acid ammonium, and red phosphorous, based on 100 parts by weight of the main resin.

8. An insulating heat-radiating unit, comprising:
a heat-radiating member or a support member; and
an insulating heat-radiating coating layer formed by treating at least a portion of an outer surface of the heat-radiating member or support member with the insulating heat-radiating coating composition according to claim 1, followed by curing.

9. The insulating heat-radiating unit according to claim 8, wherein the insulating heat-radiating coating layer has a thickness of 15 to 50 µm.

10. An insulating heat-radiating circuit board comprising:
a circuit board on which an element is mounted; and
an insulating heat-radiating coating layer formed by treating at least a portion of an outer surface of the circuit board with the insulating heat-radiating coating composition according to claim 1, followed by curing.

11. A insulating heat-radiating component for lighting, comprising:
a heat sink; and
an insulating heat-radiating coating layer on an entire or partial surface of an outer surface of the heat sink, wherein the insulating heat-radiating coating layer is formed by curing the insulating heat-radiating coating composition according to claim 1.

\* \* \* \* \*